US012796329B2

(12) United States Patent
Zhou et al.

(10) Patent No.: US 12,796,329 B2
(45) Date of Patent: Nov. 10, 2026

(54) DRIVE DEVICES AND ACOUSTIC OUTPUT DEVICES CONTAINING THE DRIVE DEVICES

(71) Applicant: SHENZHEN SHOKZ CO., LTD., Shenzhen (CN)

(72) Inventors: Wenbing Zhou, Shenzhen (CN); Qingyi Wang, Beijing (CN); Lei Zhang, Shenzhen (CN); Xin Qi, Shenzhen (CN); Fengyun Liao, Shenzhen (CN)

(73) Assignee: SHENZHEN SHOKZ CO., LTD., Shenzhen (CN)

( * ) Notice: Subject to any disclaimer, the term of this patent is extended or adjusted under 35 U.S.C. 154(b) by 726 days.

(21) Appl. No.: 18/352,218

(22) Filed: Jul. 13, 2023

(65) Prior Publication Data

US 2023/0363281 A1 Nov. 9, 2023

Related U.S. Application Data

(63) Continuation of application No. PCT/CN2022/087025, filed on Apr. 15, 2022.

(51) Int. Cl.
*H10N 30/20* (2023.01)
*H10N 30/50* (2023.01)

(52) U.S. Cl.
CPC ....... *H10N 30/2043* (2023.02); *H10N 30/508* (2023.02)

(58) Field of Classification Search
CPC ......................... H10N 30/508; H10N 30/2043
See application file for complete search history.

(56) References Cited

U.S. PATENT DOCUMENTS

| | | | |
|---|---|---|---|
| 2015/0094590 A1 | 4/2015 | Kiyose et al. |
| 2016/0264399 A1 | 9/2016 | Cheng et al. |
| 2017/0244022 A1 | 8/2017 | Kojima |
| 2018/0249256 A1 | 8/2018 | Clerici et al. |

(Continued)

FOREIGN PATENT DOCUMENTS

| | | | |
|---|---|---|---|
| CN | 102395092 A | 3/2012 |
| CN | 104811881 A | 7/2015 |

(Continued)

*Primary Examiner* — Emily P Pham
*Assistant Examiner* — Monica Mata
(74) *Attorney, Agent, or Firm* — METIS IP LLC

(57) ABSTRACT

The present disclosure provides a drive device and an acoustic output device including the drive device. The drive device comprises one or more drive units, each drive unit having a beam-like structure, the beam-like structure including a vibration output end and a fixed end and extending from the fixed end toward the vibration output end. Each drive unit includes: a piezoelectric layer configured to cause the drive unit to output a vibration from the vibration output end in response to an electrical signal; and a reinforcement layer, wherein the reinforcement layer includes one or more reinforcement components arranged in an extension direction of the beam-like structure, at least one reinforcement component of the one or more reinforcement components being arranged close to the vibration output end and having a dimension not exceeding one-half of a distance from the fixed end in the extension direction.

20 Claims, 12 Drawing Sheets

(56) References Cited

U.S. PATENT DOCUMENTS

| | | | | |
|---|---|---|---|---|
| 2019/0082264 | A1* | 3/2019 | Kang | H04R 9/025 |
| 2019/0222940 | A1 | 7/2019 | Chen et al. | |
| 2019/0327562 | A1 | 10/2019 | Cerini et al. | |
| 2020/0382876 | A1 | 12/2020 | Cerini et al. | |
| 2021/0382085 | A1 | 12/2021 | Bretthauer et al. | |
| 2022/0246831 | A1 | 8/2022 | Ikeuchi et al. | |
| 2022/0286772 | A1 | 9/2022 | Zhou et al. | |
| 2023/0034922 | A1 | 2/2023 | Tong | |

FOREIGN PATENT DOCUMENTS

| | | | |
|---|---|---|---|
| CN | 109283403 | A | 1/2019 |
| CN | 212086487 | U | 12/2020 |
| CN | 214381392 | U | 10/2021 |
| CN | 113620232 | A | 11/2021 |
| CN | 113630703 | A | 11/2021 |
| CN | 215268715 | U | 12/2021 |
| CN | 215773557 | U | 2/2022 |
| JP | 2019114958 | A | 7/2019 |

* cited by examiner

DRIVE DEVICES AND ACOUSTIC OUTPUT DEVICES CONTAINING THE DRIVE DEVICES

CROSS-REFERENCE TO RELATED APPLICATION

This application is a continuation of International Patent Application No. PCT/CN2022/087025, filed on Apr. 15, 2022, the contents of which are entirely incorporated herein by reference.

TECHNICAL FIELD

The present disclosure relates to the field of acoustic technology, and in particular to a drive device.

BACKGROUND

A piezoelectric speaker utilizes the inverse piezoelectric effect of piezoelectric material to generate vibration and radiate sound waves outwards. Compared with the traditional dynamic speaker, the piezoelectric speaker has the advantages of high electromechanical conversion efficiency, low energy consumption, small size, and high degree of integration. Under the current trend of miniaturization and integration of devices, the piezoelectric speaker has extremely broad prospects and future. However, a drive part in the piezoelectric speaker, especially in a miniature piezoelectric speaker has the problem of insufficient driving capability (e.g., output displacement), resulting in a low output sound pressure level of the piezoelectric speaker in an audible range (e.g., 20 Hz-20 kHz) of the human ear and a low sensitivity in the audible range.

Therefore, it is desired to provide a drive device to enhance its drive capability under the premise of a certain volume and power consumption.

SUMMARY

Embodiments of the present disclosure may provide a drive unit, comprising one or more drive units, each drive unit having a beam-like structure, the beam-like structure including a vibration output end and a fixed end, and extending from the fixed end toward the vibration output end, each drive unit including a piezoelectric layer used to cause the drive unit to output a vibration from the vibration output end in response to an electrical signal; and a reinforcement layer, wherein the reinforcement layer includes one or more reinforcement components arranged in an extension direction of the beam-like structure, at least one reinforcement component of the one or more reinforcement components being arranged close to the vibration output end and having a dimension not exceeding one-half of a distance from the vibration output end to the fixed end in the extension direction.

In some embodiments, the one or more reinforcement components include a first reinforcement component and a second reinforcement component, the first reinforcement component being arranged close to the vibration output end and the second reinforcement component being arranged close to the fixed end.

In some embodiments, a ratio of a dimension of the first reinforcement component along the extension direction to the distance from the vibration output end to the fixed end is in a range of 0.05-0.3, or a ratio of a dimension of the second reinforcement component along the extension direction to the distance from the vibration output end to the fixed end is in a range of 0.05-0.25.

In some embodiments, the one or more reinforcement components include multiple reinforcement components arranged at intervals in the extension direction, and a distance between two adjacent reinforcement components in the extension direction is within a range of 20-200 μm.

In some embodiments, dimensions of the multiple reinforcement components along the extension direction are decreasing at first and then increasing.

In some embodiments, reinforcement components arranged within a range of a first distance from the vibration output end have dimensions in a range of 50-400 μm along the extension direction; and reinforcement components arranged within a range of the first distance to a second distance from the vibration output end have dimensions in a range of 20-200 μm along the extension direction.

In some embodiments, the first distance is equal to ⅕ of the distance from the vibration output end to the fixed end and the second distance is equal to ⅖ of the distance from the vibration output end to the fixed end.

In some embodiments, reinforcement components arranged within a range of the second distance to a third distance from the vibration output end have dimensions in a range of 20-100 μm along the extension direction; and reinforcement components arranged in a range above the third distance from the vibration output end have dimensions in a range of 50-400 μm along the extension direction.

In some embodiments, the third distance is equal to $14/15$ of the distance from the vibration output end to the fixed end.

In some embodiments, at least one reinforcement component of the one or more reinforcement components includes multiple sub-reinforcement components arranged at intervals along a direction perpendicular to the extension direction.

In some embodiments, each drive unit further includes a substrate layer, the substrate layer being disposed between the piezoelectric layer and the reinforcement layer.

In some embodiments, a ratio of a total thickness of the reinforcement layer and the substrate layer to a thickness of the piezoelectric layer is in a range of 3 to 20.

In some embodiments, a ratio of a thickness of the reinforcement layer to a thickness of the substrate layer is in a range of 0.5 to 2.5.

In some embodiments, the substrate layer covers a gap between the one or more drive units.

In some embodiments, a gap width between two adjacent drive units in the multiple drive units is less than 25 μm.

In some embodiments, the beam-like structure of the one or more drive units has a spiral structure bent in a clockwise or counterclockwise direction.

In some embodiments, the drive device further includes: a vibration transmission unit, a vibration transmission end of each of the one or more drive units being connected to the vibration transmission unit such that a vibration of the drive device is output from the vibration transmission unit.

In some embodiments, the vibration transmission unit is connected to each drive unit by an elastic connection member.

Embodiments of the present disclosure may also provide an acoustic output device, the acoustic output device comprising a drive unit as claimed above.

A portion of the additional features of the present disclosure may be described in the following description. A portion of the additional features of the present disclosure is apparent to those skilled in the art from a study of the following description and corresponding accompanying drawings or from an understanding of the production or operation of the embodiments. The features of the present disclosure may be realized and obtained by practicing or using aspects of the methods, tools, and combinations set forth in the following detailed examples.

BRIEF DESCRIPTION OF THE DRAWINGS

The present disclosure is further illustrated in terms of exemplary embodiments. These exemplary embodiments are described in detail with reference to the drawings. These embodiments are not limited. In these embodiments, the same number represents the same structure, wherein.

DETAILED DESCRIPTION

Figure 1:
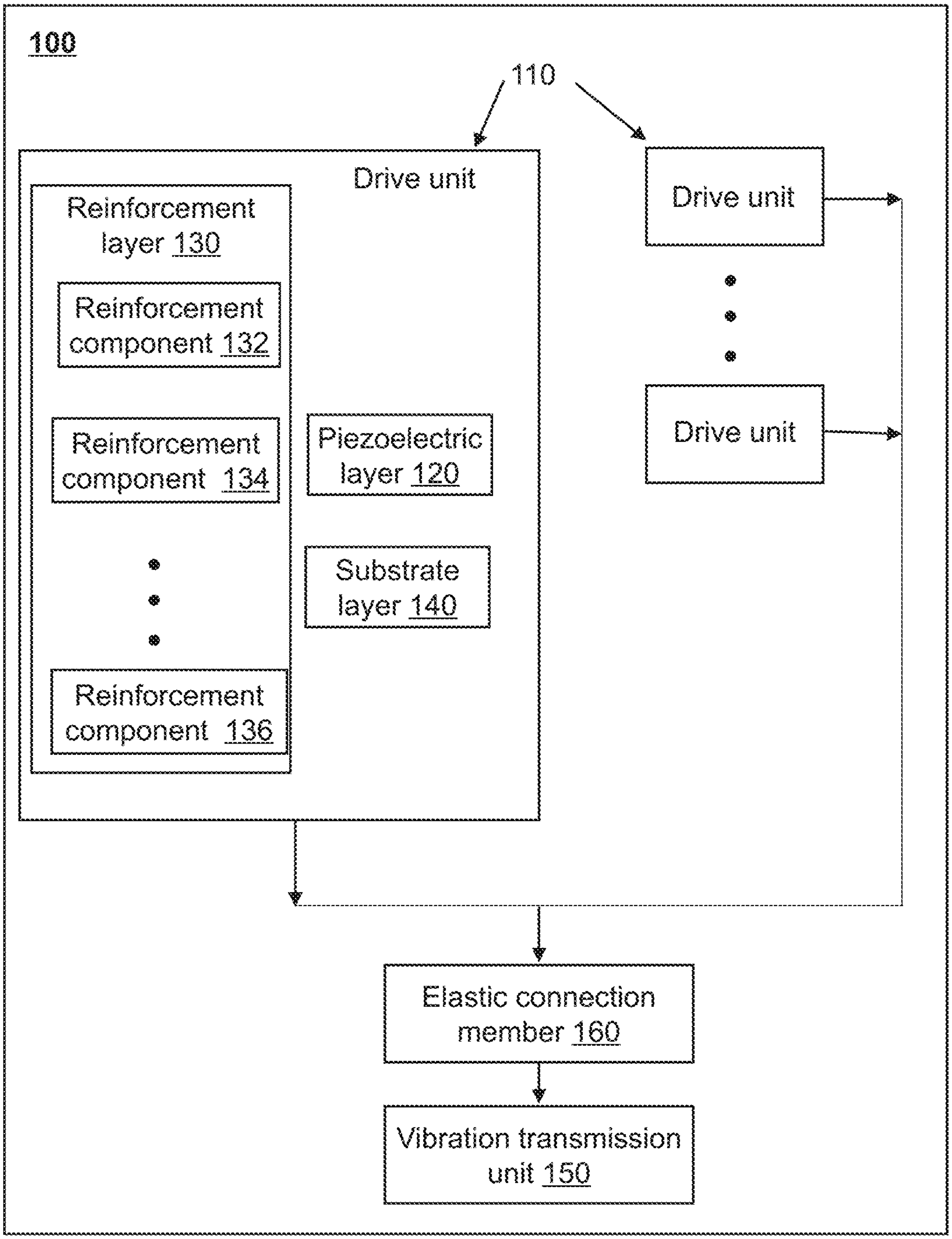
FIG. 1 is a block diagram illustrating an exemplary drive device according to some embodiments of the present disclosure.

The technical schemes of embodiments of the present disclosure will be more clearly described below, and the accompanying drawings need to be configured in the description of the embodiments will be briefly described below. Obviously, the drawings in the following description are merely some examples or embodiments of the present disclosure, and will be applied to other similar scenarios according to these accompanying drawings without paying creative labor. Unless obviously obtained from the context or the context illustrates otherwise, the same numeral in the drawings refers to the same structure or operation.

It should be understood that the "system," "device," "unit" and/or "module" used herein is a method for distinguishing different components, elements, components, parts or assemblies of different levels. However, if other words may achieve the same purpose, the words may be replaced by other expressions.

As shown in the present disclosure and the claims, unless the context clearly suggests an exception, the words "one," "a," "a kind," and/or "the" do not refer specifically to the singular, but may also include the plural. In general, the terms "include" and "comprise" suggest only the inclusion of clearly identified steps and elements that do not constitute an exclusive list, and the method or device may also contain other steps or elements. The term "based on" is "based, at least in part, on." The term "an embodiment" means "at least one embodiment"; the term "another embodiment" means "at least one additional embodiment."

In the description of the present disclosure, it should be understood that the terms "first," "second," "third," and "fourth" are used for descriptive purposes only and are not to be understood as indicating or implying relative importance or implicitly specifying the number of technical features indicated. Thus, the features qualified with "first," "second," "third," and "fourth" may expressly or implicitly include at least one such feature. In the description of the present disclosure, "multiple" means at least two, e.g., two, three, etc., unless otherwise expressly and specifically limited.

In the present disclosure, unless otherwise expressly specified and limited, the terms "connection," "fixed," etc., shall be understood in a broad sense. For example, the term "connection" may refer to a fixed connection, a detachable connection, or an integral part; a mechanical connection, or an electrical connection; a direct connection, or an indirect connection through an intermediate medium; a connection within two components or an interaction between two components, unless otherwise expressly limited. To those skilled in the art, the specific meaning of the above terms in the present disclosure can be understood on a case-by-case basis.

A drive device provided by an embodiment of the present disclosure may include one or more drive units. Each drive unit has a beam-like structure. The beam-like structure includes a vibration output end and a fixed end and extends from the fixed end toward the vibration output end. Each drive unit may include a piezoelectric layer and a reinforcement layer. The piezoelectric layer may cause the drive unit to output a vibration from the vibration output end in response to an electrical signal. The reinforcement layer may adjust a damping and stiffness of the drive unit. The reinforcement layer may include one or more reinforcement components arranged along an extension direction of the beam-like structure. At least one reinforcement component of the one or more reinforcement components is arranged close to the vibration output end and has a dimension not exceeding one-half of a distance from the vibration output end to the fixed end along the extension direction (i.e., a direction in which the fixed end of the drive unit extends toward the vibration output end)

According to some embodiments of the present disclosure, thicknesses of the reinforcement layer and the piezoelectric layer may be set so that the entire piezoelectric layer is located on the same side of a neutral plane of the beam-like structure (i.e., the whole of the piezoelectric layer and the reinforcement layer) to increase an elongation (or compression) deformation caused by a tensile stress (or compressive stress) generated by the piezoelectric layer when the beam-like structure is bent, thereby enhancing an output capability (e.g., output displacement) of the drive unit. In addition, by arranging at least one reinforcement component of the one or more reinforcement components close to the vibration output end and having a dimension along the extension direction not exceeding one-half of the distance from the vibration output end to the fixed end, it can ensure the reliability of the drive unit while reducing the load generated by the reinforcement layer on the piezoelectric layer, thereby further enhancing the output capability of the drive unit.

Acoustic output devices provided by embodiments of the present disclosure are described in detail below in conjunction with the accompanying drawings.

Figure 5:
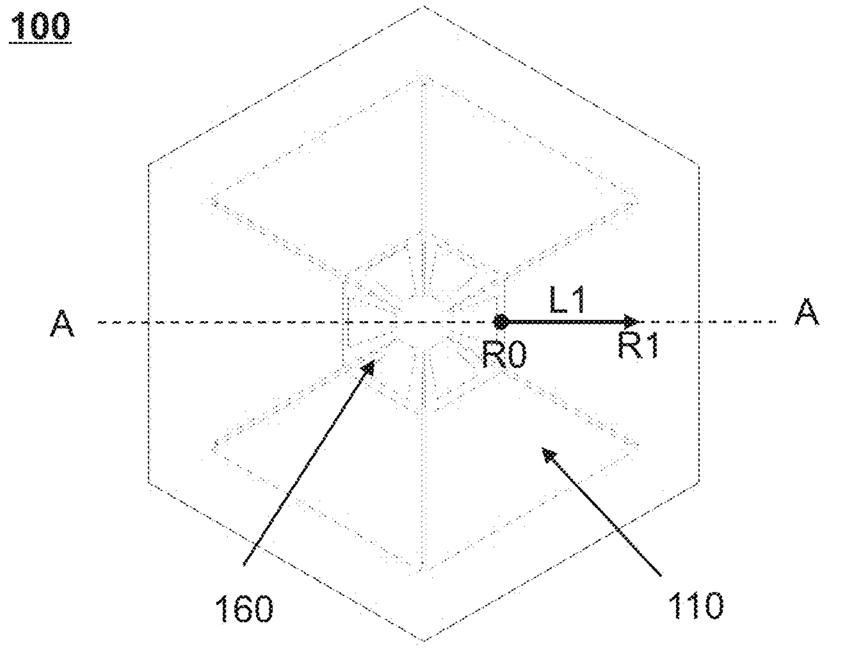
FIG. 5 is a schematic diagram illustrating an exemplary drive device according to some embodiments of the present disclosure.
Figure 17:
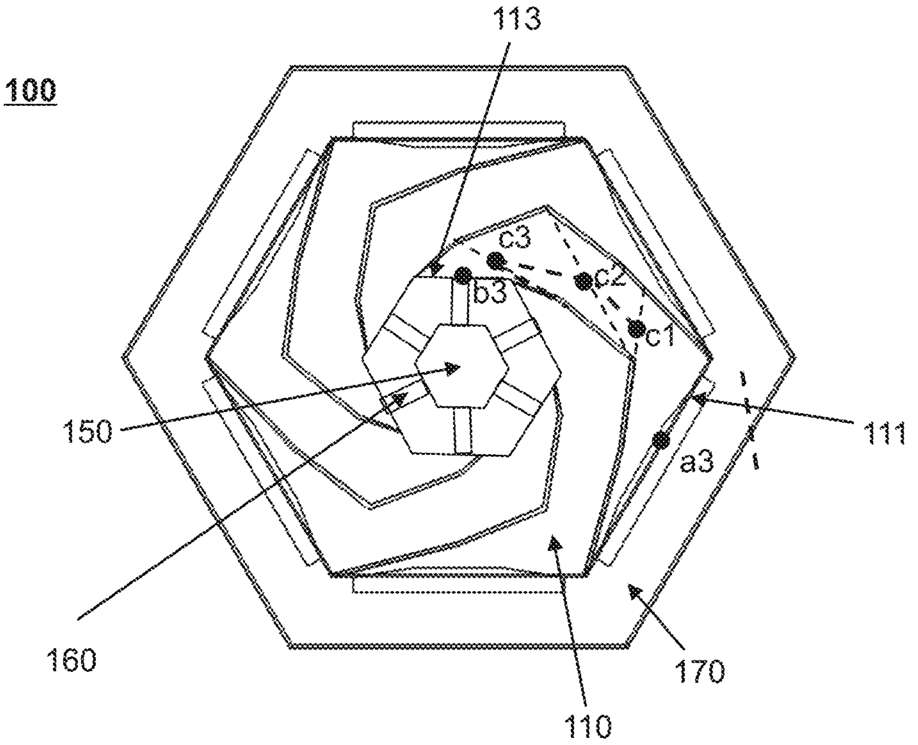
FIG. 17 is another schematic diagram illustrating some structures of exemplary drive devices according to some embodiments of the present disclosure.
Figure 19:
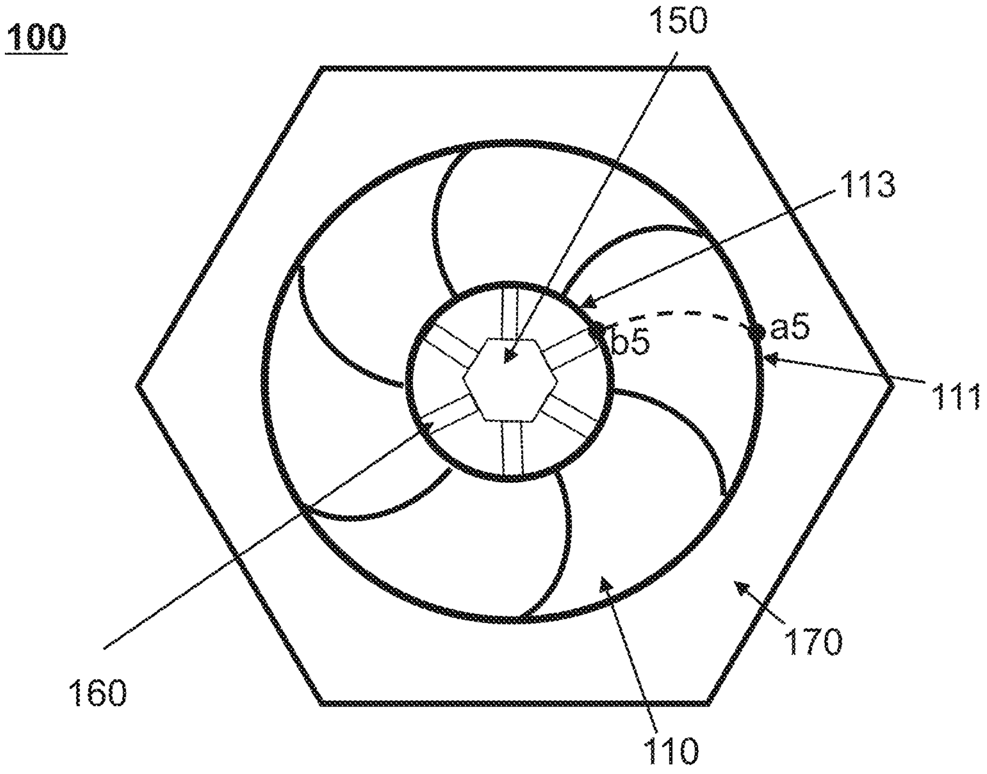
FIG. 19 is another schematic diagram illustrating some structures of exemplary drive devices according to some embodiments of the present disclosure.
Figure 21:
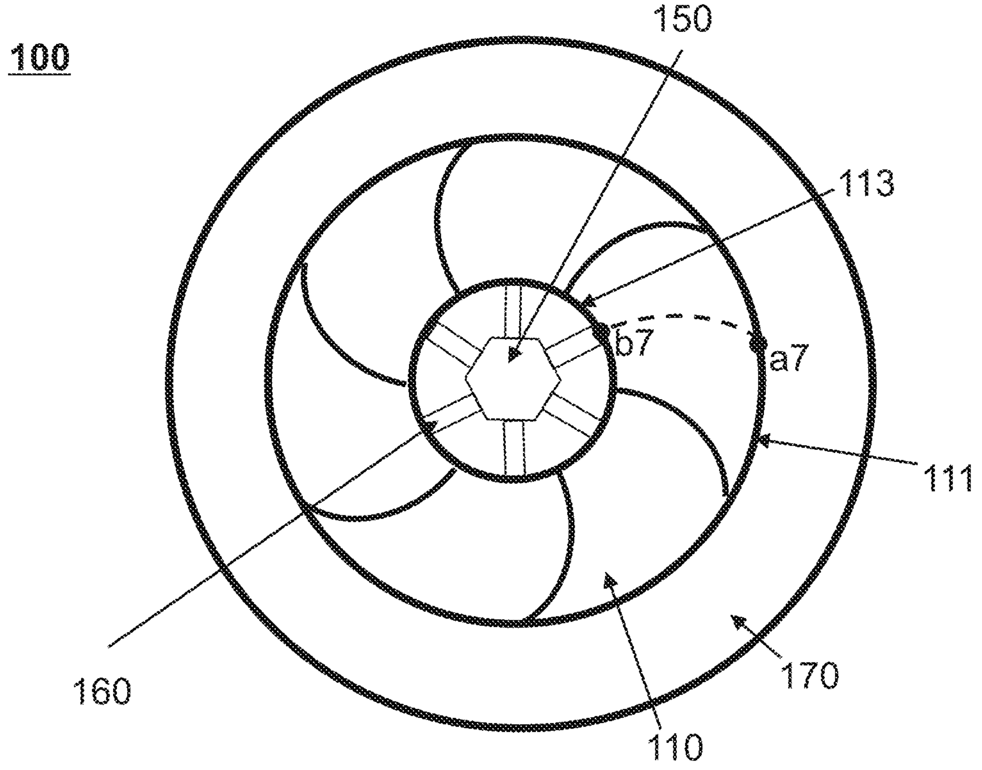
FIG. 21 is another schematic diagram illustrating some structures of exemplary drive devices according to some embodiments of the present disclosure.

FIG. 1 is a block diagram illustrating an exemplary drive device according to some embodiments of the present disclosure. As shown in FIG. 1, the drive device 100 may include one or more drive units 110. In some embodiments, a shape of the drive unit 110 may be circular, oval, triangular, quadrilateral, pentagonal, hexagonal, etc., or other irregular shapes. In some embodiments, the one or more drive units 110 may be regularly or irregularly arranged so that an overall structure of the drive device 100 is circular, oval, quadrilateral, pentagonal, hexagonal, octagonal, and any other polygonal shapes, etc. For example, as shown in FIG. 5, the drive unit 110 may be an isosceles triangle, and the drive device 100 may be a regular hexagon formed by six drive units 110. As another example, as shown in FIG. 17, the drive unit 110 may be an irregular polygon, and the drive device 100 may be a regular hexagon formed by multiple drive units 110. As a further example, as shown in FIG. 19, the drive unit 110 may be an irregular shape consisting of multiple curved edges, and the drive device 100 may be a regular hexagon consisting of multiple drive units 110. As further another example, as shown in FIG. 21, the drive unit 110 may be an irregular shape formed by multiple curved edges, and the drive device 100 may be a circle formed by multiple drive units 110. In the present disclosure, the drive device 100 is described with the drive unit being hexagonal as an example.

The drive unit 110 may include a beam-like structure. The beam-like structure may include a vibration output end and a fixed end (e.g., a vibration output end 113 and a fixed end 111 in FIG. 6). The beam-like structure may extend from the fixed end toward the vibration output end (or from the vibration output end toward the fixed end). In other words, the drive unit 110 may have a beam-like structure extending from the fixed end toward the vibration output end (or from the vibration output end toward the fixed end). In some embodiments, the drive unit 110 may include a piezoelectric layer 120 and a reinforcement layer 130.

The piezoelectric layer 120 may cause the drive unit 110 to output a vibration from the vibration output end in response to an electrical signal. In an extension direction from the fixed end to the vibration output end, the piezoelectric layer 120 may partially or completely cover the beam-like structure. The piezoelectric layer 120 may deform in response to a drive voltage, thereby generating vibration. In some embodiments, the piezoelectric layer 120 may include a piezoelectric material layer and two electrode material layers. The two electrode material layers may be located on opposite sides of the piezoelectric material layer along a thickness direction, respectively. In some embodiments, the piezoelectric material layer may be made of a material having a piezoelectric effect (e.g., piezoelectric ceramic, piezoelectric quartz, piezoelectric crystal, piezoelectric polymer, etc.). Exemplarily, the material of the piezoelectric material layer may include, but is not limited to, aluminum nitride (AlN), lead zirconate titanate (PZT), zinc oxide (ZnO), etc. In some embodiments, the electrode material layer(s) may be made of a material that is more conductive (e.g., a metal, an alloy, a conductive polymer material, etc.). For example, the electrode material layer(s) may include metal molybdenum, copper, gold, titanium, aluminum, titanium gold alloy, etc.

The reinforcement layer 130 may modify a mechanical property of the drive unit 110, such as providing a damping and a stiffness of the drive unit 110. In some embodiments, the reinforcement layer 130 may be affixed to the piezoelectric layer 120 (e.g., the electrode material layer(s). The piezoelectric layer 120 may drive the reinforcement layer 130 to vibrate. In some embodiments, the reinforcement layer 130 may be made of a semiconductor material, a polymer material, etc. Exemplary semiconductor materials may include silicon (Si), silicon oxide ($SiO_2$), silicon nitride (SiNx), silicon carbide (SiC), etc. Exemplary polymer materials may include polyimide (Polyimide, PI), parylene, polydimethylsiloxane (PDMS), hydrogel, photoresist, silicone, silicone gel, silicon sealant, etc. In some embodiments, the reinforcement layer 130 may have a single-layer or multi-layer structure. For example, the reinforcement layer 130 may have a single-layer structure made of a semiconductor material (e.g., Si, $SiO_2$) or a polymer material (e.g., polyimide). As another example, the reinforcement layer 130 may have a multi-layer structure made of multiple semiconductor materials (e.g., Si/$SiO_2$ bilayer structure, Si/SiNx bilayer structure, etc.). As another example, the reinforcement layer 130 may have a multi-layer structure prepared from multiple polymeric materials. As another example, the reinforcement layer 130 may have a multi-layer structure made of a polymeric material and a semiconductor material.

Figure 6:
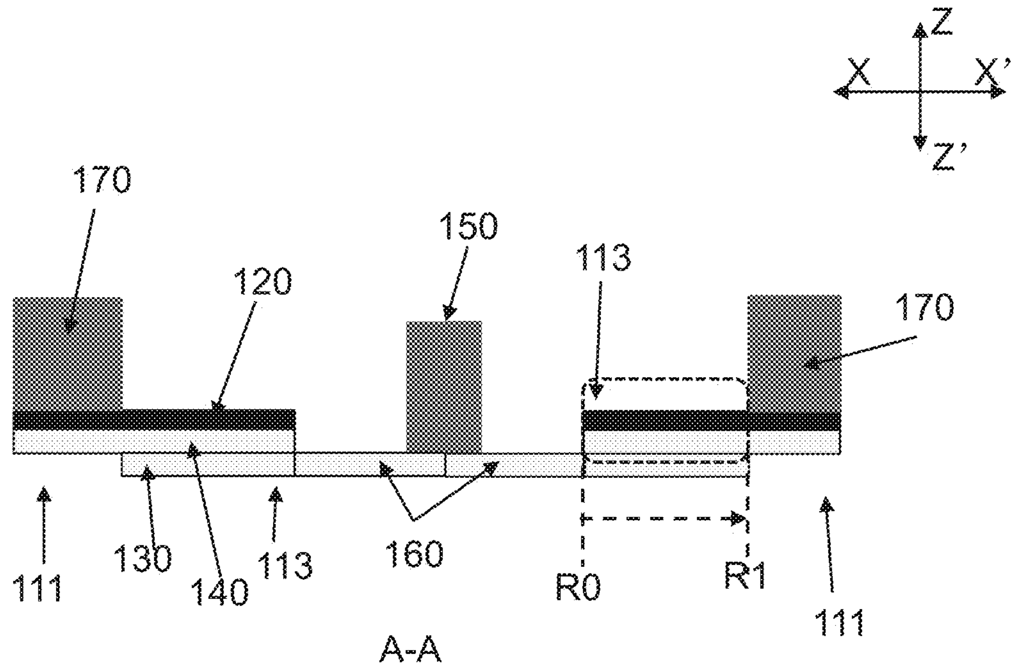
FIG. 6 is a schematic diagram illustrating a cross-sectional A-A of the drive device in FIG. 5.

In some embodiments, the reinforcement layer 130 may include one or more reinforcement components (e.g., reinforcement components 132, 134, 136, etc.) arranged along an extension direction of the beam-like structure (which may also be referred to as the extension direction of the drive unit 110) (e.g., the XX' direction as shown in FIG. 6). At least one reinforcement component may be arranged close to the vibration output end, and a dimension of the reinforcement component in the extension direction does not exceed one-half of a distance from the vibration output end to the fixed end. In the present disclosure, the extension direction of the beam-like structure or the drive unit 110 may refer to a direction extending from a center of the fixed end of the drive unit 110 or the beam-like structure along a center line of the beam-like structure toward a center of the vibration output end thereof (or a direction extending from the center of the vibration output end along the center line of the beam-like structure toward the center of the fixed end).

In some embodiments, when the two electrode material layers of the piezoelectric layer 120 are on different sides of the neutral plane of the beam-like structure (or the drive unit 110), this can lead to a situation where stresses and displacements of different parts of the piezoelectric material layer located at both sides of the neutral plane of the beam-like structure cancel each other out when a voltage is applied to the drive unit 110, thereby weakening the output capability of the drive unit 110. In this case, by adjusting the thickness of the piezoelectric layer 120 and/or the reinforcement layer 130, the piezoelectric layer 120 can be located as a whole on one side of the neutral plane of the beam-like structure, so that the elongation (or compression) deformation resulting from a tensile (or compressive) stress of the piezoelectric layer 120 is not offset when the drive unit 110 is bent, resulting in a greater displacement or force output from the vibration output end. In some embodiments, a distance between a geometric mid-plane of the piezoelectric layer 120 and a neutral plane of the beam-like structure may be increased by increasing the thickness of the reinforcement layer 130, thereby increasing an output performance (i.e., an output displacement at the output end) of the drive unit 110. In the present disclosure, the neutral plane may refer to a transition plane in a thickness direction of the beam-like structure during a bending vibration process of the drive unit 110 having a beam-like structure. The transition plane produces neither a tensile nor a compressive deformation along the extension direction of the beam-like structure. In other words, the neutral plane may refer to a plane in which the beam-like structure or the drive unit 110 is subjected to a positive stress equal to zero during the bending vibration process. For more information about the thicknesses of the piezoelectric layer 120 and/or the reinforcement layer 130, please refer to FIG. 2 and its related description.

In some embodiments, the stiffness or damping of the beam-like structure (or the drive unit 110) may be adjusted by adjusting a layout of the one or more reinforcement components, thereby adjusting the output performance of the drive unit 110. For example, the one or more reinforcement components may include a first reinforcement component and a second reinforcement component. The first reinforcement component may be arranged near the vibration output end, and the second reinforcement component may be arranged near the fixed end. As another example, the one or more reinforcement components may include multiple reinforcement components arranged at intervals along the extension direction. Dimensions of the multiple reinforcement components along the extension direction may be decreasing at first and then increasing. For more information about the arrangement of the reinforcement components, please refer to FIGS. 8 to 14 and their descriptions, which are not repeated here.

In some embodiments, the drive unit 110 may include a substrate layer 140. The substrate layer 140 may be provided between the piezoelectric layer 120 and the reinforcement layer 130. In some embodiments, the substrate layer 140 may cooperate with the reinforcement layer 130 to adjust the stiffness and damping of the drive unit 110, as well as the position of the neutral plane of the drive unit 110, so as to adjust the output performance of the drive unit 110. For example, a thickness of the substrate layer 140 may be adjusted so that the piezoelectric layer 120 is located overall on one side of the neutral plane of the beam-like structure so that the elongation (or compression) deformation resulting from the tensile (or compressive) stress of the piezoelectric layer 120 can produce greater vibration when the drive unit 110 is bent. As another example, the stiffness of the drive unit 110 may be adjusted by partially covering or fully covering the reinforcement layer 130 on the substrate layer 140, thereby adjusting the structural reliability of the drive unit 110.

In some embodiments, a material of the substrate layer 140 may be the same as or different from the material of the reinforcement layer 130. For example, the substrate layer 140 may be made of a semiconductor material, a polymer material, etc. The material of the substrate layer 140 and the reinforcement layer 130 may both be Si. As another example, the material of the substrate layer 140 may include Si and $SiO_2$, and the material of the reinforcement layer 130 may include Si and PDMS. In some embodiments, the substrate layer 140 may have a single-layer or multi-layer structure. For example, the substrate layer 140 may have a single-layer structure made of a semiconductor material (e.g., Si, $SiO_2$) or a polymer material (e.g., polyimide). As another example, the substrate layer 140 may have a multi-layer structure made of multiple semiconductor materials (e.g., Si/$SiO_2$ bilayer structure, Si/SiNx bilayer structure, etc.). As further another example, the substrate layer 140 may have a multi-layer structure prepared by multiple polymeric materials. As still another example, the substrate layer 140 may have a multi-layer structure made of a polymeric material and a semiconductor material.

In some embodiments, the drive device 100 may also include a vibration transmission unit 150. The vibration output end of each of the one or more drive units 110 may be connected to the vibration transmission unit 150 such that the vibration of the drive device 100 may be output through the vibration transmission unit 150. For example, the vibration output end of each drive unit 110 may be connected to the vibration transmission unit 150 by an elastic connection member 160.

The elastic connection member 160 may be any elastic component. In some embodiments, a material of the elastic connection member 160 may include a semiconductor material (e.g., silicon, silicon oxide, silicon nitride, silicon carbide, etc.), polyimide, poly(parylene), hydrogel, PDMS, photoresist, silicone, silicone gel, silicon sealant, etc., or any combination thereof. In some embodiments, the elastic connection member 160 may include a single-layer structure or a multi-layer structure. For example, the elastic connection member 160 may have a single-layer structure made of parylene. As another example, the elastic connection member 160 may have a two-layer structure prepared by parylene and polyimide. In some embodiments, the elastic connection member 160 may be located on one side of the drive unit 110 provided with the reinforcement layer 130. For example, the elastic connection member 160 may be affixed to an outer end of the reinforcement layer 130 (e.g., near the vibration output end). As another example, when the reinforcement layer 130 is provided near the fixed end, the elastic connection member 160 may be directly attached to the substrate layer 140. In some embodiments, a height of the elastic connection member 160 may be equal to a height of the reinforcement layer 130 (as shown in FIG. 6). In some embodiments, the height of the elastic connection member 160 may be equal to the thickness of the beam-like structure of the drive unit (i.e., the total thickness of the piezoelectric layer 120, the reinforcement layer 130, the substrate layer 140, etc.).

In some embodiments, the drive device 100 may be used in a speaker, a micro motor, a micro pump, a micro mirror, a flow meter, an electric motor, and other drivers. Exemplarily, the drive device 100 may be used as a drive portion in a speaker (e.g., a bone conduction speaker, an air conduction speaker, or a speaker with a combination of bone and air conduction). The vibration output from drive device 100 or drive unit 110 may produce a sound in an audible frequency range of the human ear (e.g., 20 Hz-20 kHz). In some embodiments, the speaker may include a stereo, an earphone, glasses, a hearing aid, an augmented reality (AR) device, a virtual reality (VR) device, etc., or other devices with audio playback capabilities (e.g., a cell phone, a computer, etc.).

The drive device 100 may provide a drive force for the speaker. In some embodiments, each drive unit 110 in the drive device 100 may be fixedly connected to a housing of the speaker via the fixed end, respectively, and may be connected to a vibration portion of the speaker via the vibration output end. For example, the drive unit 110 may be connected to the vibration portion of the speaker (e.g., a diaphragm assembly) through the vibration transmission unit 150, so that the vibration of the drive device 100 may be transmitted to the vibration portion of the speaker through the vibration transmission unit 150 and output. During the operation of the speaker, the drive device 100 may convert electrical energy into mechanical energy to output force and displacement, and transmit the vibration to the vibration portion of the speaker. The vibration portion is a load portion of the drive device 100, which may receive the mechanical energy (e.g., force or displacement, etc.) transmitted by the drive device 100 and generate vibration, thereby causing the speaker to produce sound. For example, the vibration portion may generate a desired sound by pushing air outward to radiate sound pressure.

In some embodiments, the drive device 100 may also directly act as an acoustic pressure drive portion, where the drive device 100 may convert electrical energy into mechanical energy to output force and displacement and directly drive the air vibration to produce a desired acoustic pressure (i.e., sound). In this case, in order to ensure that vibrations of multiple drive units 110 in the drive device 100 do not interfere with each other while reducing the leakage of sound generated by vibrations of the drive units 110, a gap width between any two adjacent drive units 110 in the drive device 100 may be less than 25 μm. In some embodiments, at least one of the reinforcement layer 130 and the substrate layer 140 may cover the gap between any two adjacent drive units 110 to prevent sound generated by the vibration of the drive device 100 from leaking through the gap and affecting the output performance of the speaker. In some embodiments, the multiple drive units 110 may include the same reinforcement layer 130 and/or substrate layer 140, i.e., the reinforcement layer 130 and/or the substrate layer 140 may cover the gap between any two adjacent drive units 110 to prevent sound generated by the vibration of the drive device 100 from leaking through the gap.

In some embodiments, the output performance of the drive device 100 (or the drive unit 110) may be related to the efficiency of vibration transmission between the drive device 100 (or the drive unit 110) and its load (e.g., the vibration portion of the speaker). The efficiency of vibration transmission between the drive device 100 and its load may be related to an impedance of the drive device 100 (or the drive unit 110) and an impedance of the load. Thus, the output performance of the drive device 100 (or the drive unit 110) may be improved by adjusting the impedance of the drive device 100 (or the drive unit 110) and/or the impedance of its load. For example, the output performance of the drive device 100 (or the drive unit 110) may be improved by matching or substantially matching the impedance of the drive device 100 (or the drive unit 110) to the impedance of its load. For more information about the impedance matching, please refer to FIGS. 5 to 7 and their descriptions in the present disclosure.

It should be noted that the above description of FIG. 1 is provided for illustrative purposes only and is not intended to limit the scope of the present disclosure. For those skilled in the art, a variety of variations and modifications may be made in accordance with the guidance of the present disclosure. For example, in some embodiments, one or more components of the drive device 100 may be replaced by other elements capable of performing similar functions. For example, the drive device 100 may not include the substrate layer 140, and the reinforcement layer 130 may be directly affixed to the piezoelectric layer 120. At this point, the reinforcement layer 130 may be made of a semiconductor material (e.g., one or more of Si, $SiO_2$, $SiN_x$, etc.). These variations and modifications do not depart from the scope of the present disclosure.

Figure 2:
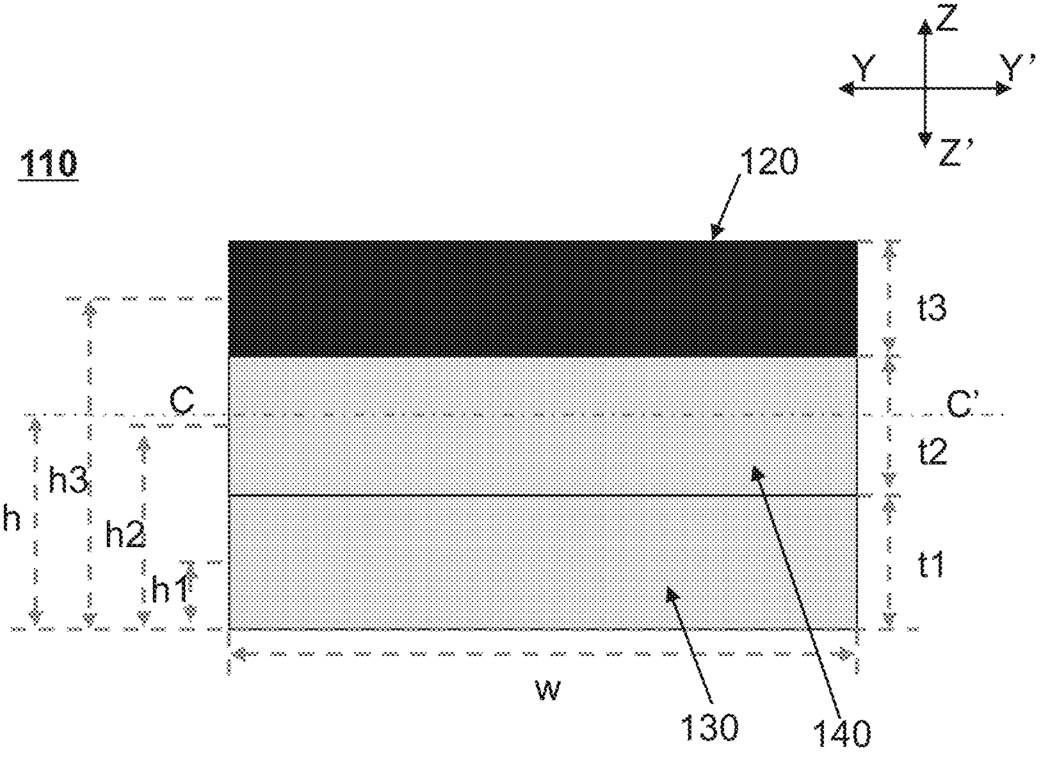
FIG. 2 is a schematic diagram illustrating a cross-section of an exemplary drive unit along a direction perpendicular to an extension direction of its beam-like structure according to some embodiments of the present disclosure.
Figure 3:
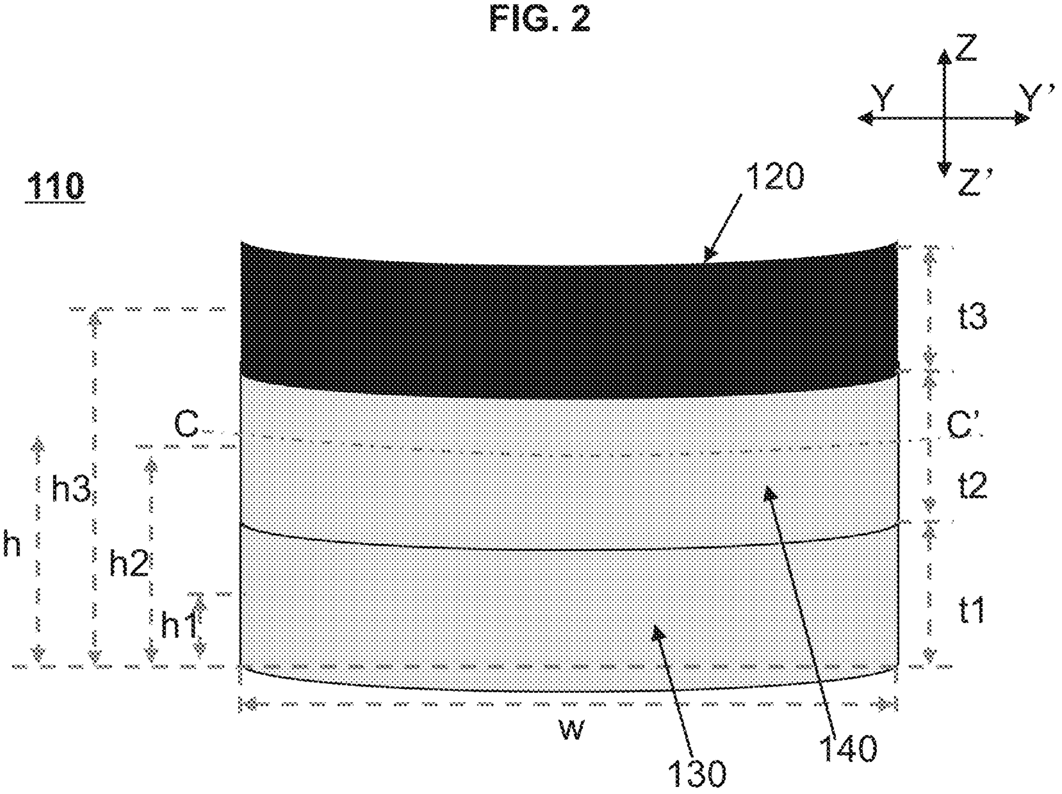
FIG. 3 is a schematic diagram illustrating a cross-section of an exemplary drive unit along a direction perpendicular to an extension direction of its beam-like structure when the drive unit undergoes bending vibration deformation according to some embodiments of the present disclosure.

FIG. 2 is a schematic diagram illustrating a cross-section of an exemplary drive unit along a direction perpendicular to an extension direction of its beam-like structure according to some embodiments of the present disclosure. FIG. 3 is a schematic diagram illustrating a cross-section of an exemplary drive unit along a direction perpendicular to an extension direction of its beam-like structure when the drive unit undergoes bending vibration deformation according to some embodiments of the present disclosure. Since the drive unit 110 is subjected to a tensile force on one side and an extrusion force on the other side along the thickness direction of its beam-like structure (i.e., the ZZ' direction) during bending vibration, there exists a transition plane in a cross-section perpendicular to its vibration direction that is neither subjected to the tensile force nor to the extrusion force, and a positive stress in the transition plane is equal to zero. In the present disclosure, the transition plane may be referred to as a neutral plane of the drive unit 110. It should be known that a position of the neutral plane of the beam-like structure is not necessarily in a middle position in its thickness direction (such as the ZZ' direction in FIG. 2). Any drive unit 110 with a beam-like structure may have its corresponding neutral plane during vibration.

In some embodiments, as shown in FIG. 3, when the piezoelectric layer 120 is stretching deformed driven by a voltage, a structure (e.g., the entire reinforcement layer 130 and a portion of the substrate layer 140) on the opposite side of the neutral plane of the drive unit 110 may be deformed in an opposite way, thereby driving the beam-like structure to produce a bending deformation and outputting a displacement along the ZZ' direction. If different parts of the piezoelectric layer 120 are at different sides of the neutral plane of the beam-like structure (or the drive unit 110) (i.e., when the neutral plane of the beam-like structure passes through the piezoelectric layer 120), this may lead to a situation where the stress and the displacement of the piezoelectric material layer located near the neutral plane position of the beam-like structure cancel each other out when a voltage is applied to the drive unit 110, thereby weakening the output capability of the drive unit 110. Therefore, for the drive unit 110 with a beam-like structure, in order to enable the drive unit 110 to produce a maximum displacement output during operation, the position of the neutral plane of the beam-like structure may be designed and optimized so that the entire piezoelectric layer 120 is located at the same side of the neutral plane of the drive unit 110.

As shown in FIGS. 2 and 3, the drive unit 110 may include three layers, which may be the reinforcement layer 130 of the first layer, the substrate layer 140 of the second layer, and the piezoelectric layer 120 of the third layer in sequence. The dashed line CC' indicates the position of the neutral plane of the drive unit 110. The rectangular cross-sectional area $A_i$ of the i-th layer structure may be determined according to equation (1):

$$A_i = t_i w, \tag{1}$$

where $t_i$ denotes the thickness of the i-th layer structure and w denotes the width of the beam-like structure of the drive unit 110.

The position of the neutral plane of the drive unit 110 (or the beam-like structure) may be related to a material thickness of each layer structure and its Young's modulus, and the position of the neutral plane of the drive unit 110 may be expressed by a distance h from the neutral plane of the drive unit to a surface of the reinforcement layer 130. By way of example only, h may be determined according to equation (2):

$$h = \frac{\sum E_i h_i A_i}{\sum E_i A_i}, \tag{2}$$

where $E_i$ denotes the Young's modulus of the material of the i-th layer structure and $h_i$ denotes a distance from a geometric center plane of the i-th layer structure to the surface of the reinforcement layer 130. It should be known that in the present disclosure, the geometric center plane of the i-th layer structure (e.g., the piezoelectric layer 120, the reinforcement layer 130, or the substrate layer 140) refers to a geometric center plane of the i-th layer structure along the vibration direction of the beam-like structure.

Further, a rotational inertia $I_i$ of each layer of the multi-layer structure of the drive unit 110 may meet:

$$I_i = \frac{w t_i^3}{12} + A_i (h_i - h)^2. \tag{3}$$

An average stress σ(x) at different positions x of the piezoelectric layer 120 along the extension direction of the beam-like structure (i.e., a direction simultaneously perpendicular to the directions ZZ' and YY') may meet equation (4):

$$\sigma(x) = -\frac{M(x)(h_3 - h)}{I_3}, \tag{4}$$

where M(x) denotes a bending torque applied externally. In some embodiments, the application of the bending torque may be achieved by the direct application of a mechanical bending torque or by electrical conversion. Exemplarily, a voltage may be applied to the two electrode material layers of the piezoelectric layer 120, and the piezoelectric layer 120 is deformed by the inverse piezoelectric effect to achieve the application of the bending torque.

The average stress σ(x) at different positions x of the piezoelectric layer 120 along the extension direction of the beam-like structure determines an elongation or compression of the piezoelectric layer 120 in the drive unit 110 at different positions along the extension direction of the beam-like structure. A larger average stress σ(x) may cause a larger elongation or compression of the corresponding piezoelectric layer 120, and thus cause a larger output displacement of the piezoelectric layer 120.

From equation (4), it can be seen that the magnitude of the average stress σ(x) at different positions x of the piezoelectric layer 120 along the extension direction of the beam-like structure is inversely correlated with the rotational inertia 13 of the piezoelectric layer 120 in the drive unit 110, and the magnitude of the average stress σ(x) at different positions x of the piezoelectric layer 120 along the extension direction of the beam-like structure is positively correlated with a distance between the geometric center plane of the piezoelectric layer 120 and the neutral plane of the drive unit 110. Therefore, in some embodiments, the stress σ(x) of the piezoelectric layer 120 may be increased by increasing the distance between the geometric center plane of the piezoelectric layer 120 and the neutral plane of the drive unit 110 (i.e., $h_3$–h in equation (4)), such that under the same voltage input, the drive unit 110 (or the beam-like structure) may output a larger displacement perpendicular to a length and width direction of the drive unit 110 (i.e., displacement in the ZZ' direction in FIG. 2), thereby enhancing the output performance of the drive unit 110 (or the drive device 100). In some embodiments, in order to maximize the distance between the geometric center plane of the piezoelectric layer 120 and the neutral plane of the drive unit 110, the thickness of the substrate layer 140 and/or the reinforcement layer 130 may be as large as possible compared to the thickness of the piezoelectric layer 120.

In some embodiments, since the substrate layer 140 and the reinforcement layer 130 themselves do not provide the role of electrical and force conversion, but are loads compared to the piezoelectric layer 120, when the thickness of the substrate layer 140 and/or the reinforcement layer 130 is too large, the load of the piezoelectric layer 120 in the beam-like structure of the drive unit 110 may be too large, resulting in a reduction of the final displacement output of the beam-like structure of the drive unit 110. Therefore, the thickness of the substrate layer 140 and the thickness of the reinforcement layer 130 need to be designed in coordination.

Further referring to FIGS. 2 and 3, the total thickness $t_p$ of the reinforcement layer 130 and the substrate layer 140 may be determined according to equation (5) as follows:

$$t_p = t_1 + t_2, \tag{5}$$

where $t_1$ denotes the thickness of the reinforcement layer 130 and $t_2$ denotes the thickness of the substrate layer 140.

A ratio α of the total thickness $t_p$ of the reinforcement layer 130 and the substrate layer 140 to the thickness $t_3$ of the piezoelectric layer 120 may be determined according to equation (6):

$$\alpha = \frac{t_p}{t_3}. \quad (6)$$

Figure 4:
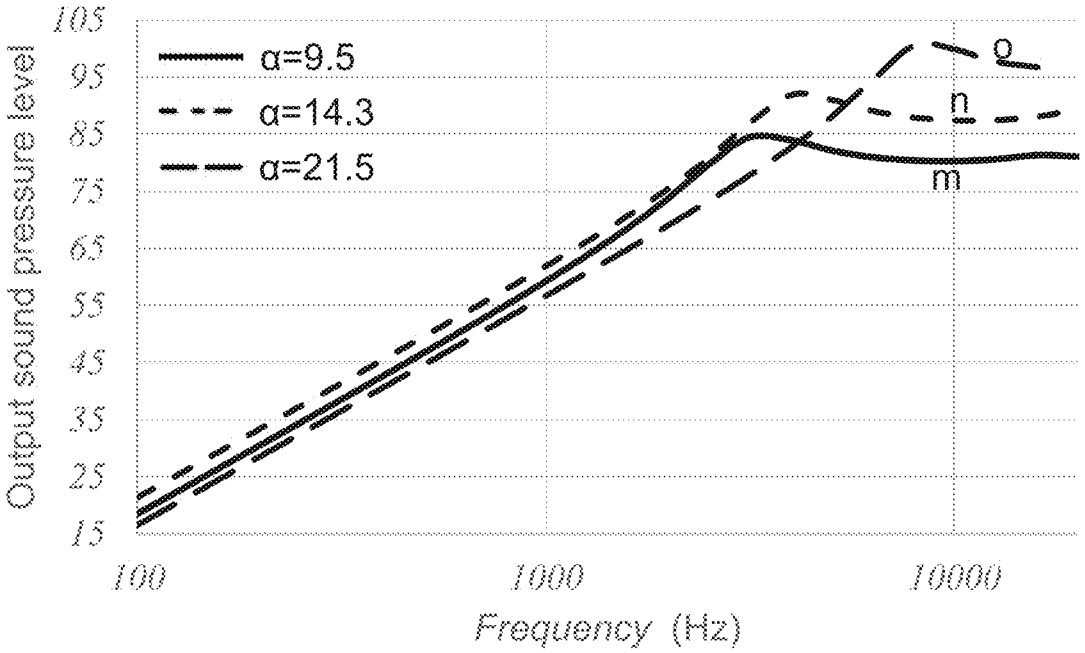
FIG. 4 is a frequency response curve diagram of a speaker when drive units corresponding to different ratios of a total thickness of a substrate layer and a reinforcement layer to a thickness of a piezoelectric layer are applied to the speaker, according to some embodiments of the present disclosure.

FIG. 4 is a frequency response curve diagram of a speaker when drive units corresponding to different ratios of a total thickness of a substrate layer and a reinforcement layer to a thickness of a piezoelectric layer are applied to the speaker, according to some embodiments of the present disclosure. As shown in FIG. 4, curves m, curve n, and curve o denote a frequency response curve of a speaker corresponding to the drive unit when the ratio α of the total thickness $t_p$ of the reinforcement layer 130 and the substrate layer 140 to the thickness $t_3$ of the piezoelectric layer 120 is equal to 9.5, 14.3, and 21.5, respectively. As can be seen in FIG. 4, when the ratio α of the total thickness $t_p$ of the reinforcement layer 130 and the substrate layer 140 to the thickness $t_3$ of the piezoelectric layer 120 is small (e.g., corresponding to curve m), and since the distance between the geometric center plane of the piezoelectric layer 120 and the neutral plane of the drive unit 110 is small, with the same deformation of the piezoelectric layer 120, the output displacement of the beam-like structure of the drive unit 110 in its vibration direction (e.g., in the ZZ' direction in FIG. 2) is reduced, which leads to a lower output sound pressure level (SPL) of the speaker.

When the ratio α of the total thickness $t_p$ of the reinforcement layer 130 and the substrate layer 140 to the thickness $t_3$ of the piezoelectric layer 120 gradually increases (changes from curve m to curve o), although the distance between the geometric center plane of the piezoelectric layer 120 and the neutral plane of the drive unit 110 increases, however, since the substrate layer 140 and the reinforcement layer 130 themselves do not provide the role of electrical and force conversion, but are loads compared to the piezoelectric layer 120, it may cause the load of the piezoelectric layer 120 to be too large and the overall stiffness of the drive unit 110 to increase, thus leading to a reduction in the final output displacement of the beam-like structure of the drive unit 110, which in turn leads to a reduction in the output sound pressure level of the speaker. In addition, the increased stiffness of the drive unit 110 (i.e., the drive device 100) increases a first resonance frequency of the speaker, as well as increases the output sound pressure level after the first resonance peak. Therefore, for the drive unit 110 (i.e., the drive device 100) that mainly seeks high sensitivity in a mid-high frequency (e.g., 500 Hz-10 kHz) range, the ratio α of the total thickness $t_p$ of the reinforcement layer 130 and the substrate layer 140 to the thickness $t_3$ of the piezoelectric layer 120 may be set larger.

In order to improve the sensitivity of the drive unit 110 in the mid-high frequency range while avoiding excessive loading caused by the excessively thick reinforcement layer 130 and/or substrate layer, in some embodiments, the ratio α of the total thickness $t_p$ of the reinforcement layer 130 and the substrate layer 140 to the thickness $t_3$ of the piezoelectric layer 120 may take a value in the range of 2-50. In some embodiments, the ratio α of the total thickness $t_p$ of the reinforcement layer 130 and the substrate layer 140 to the thickness $t_3$ of the piezoelectric layer 120 may take a value in the range of 3-20. In some embodiments, the ratio α of the total thickness $t_p$ of the reinforcement layer 130 and the substrate layer 140 to the thickness $t_3$ of the piezoelectric layer 120 may take a value in the range of 4-15. In some embodiments, the ratio α of the total thickness $t_p$ of the reinforcement layer 130 and the substrate layer 140 to the thickness $t_3$ of the piezoelectric layer 120 may take a value range of 5-10. In some embodiments, the drive unit 110 does not include the substrate layer 140, and the performance of the drive unit 110 may be adjusted by adjusting a ratio of the thickness of the reinforcement layer 130 to the piezoelectric layer 120. Preferably, the ratio of the thickness of the reinforcement layer 130 to the thickness of the piezoelectric layer 120 may take a value in the range of 2-50. More preferably, the ratio of the thickness of the reinforcement layer 130 to the thickness of the piezoelectric layer 120 may take a value in the range of 3-20.

Figure 7:
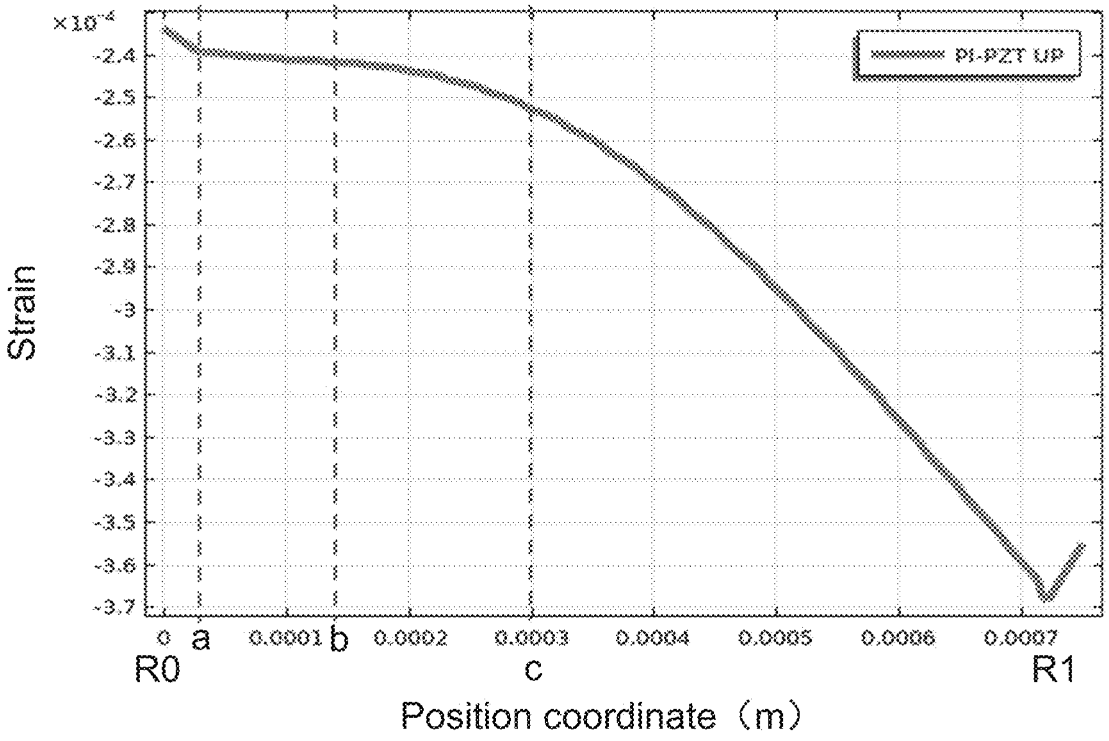
FIG. 7 is a schematic diagram illustrating a strain curve of a piezoelectric layer along an extension direction of a beam-like structure of a drive unit according to some embodiments of the present disclosure.

FIG. 5 is a schematic diagram illustrating an exemplary drive device according to some embodiments of the present disclosure. FIG. 6 is a schematic diagram illustrating a cross-sectional A-A of the drive device in FIG. 5. FIG. 7 is a schematic diagram illustrating a strain curve of a piezoelectric layer along an extension direction of a beam-like structure of a drive unit according to some embodiments of the present disclosure. In some embodiments, as shown in FIG. 5, the drive device 100 may include six drive units 110 with a beam-like structure. The six drive units 110 may form a hexagonal structure. There may be a gap between any two adjacent drive units 100. In some embodiments, the gap may be covered by a substrate layer 140 and/or a reinforcement layer. In some embodiments, the drive unit 110 may include a piezoelectric layer 120, a reinforcement layer 130, the substrate layer 140, and a vibration transmission unit 150. One end of the drive unit 110 (i.e., the fixed end 111) may be fixed by a fixing component 170, and the other end of the drive unit 110 (i.e., the vibration output end 113) may be connected to the vibration transmission unit 150. For example, when the drive device 100 is applied to a speaker, the fixed end 111 of each drive unit 110 may be fixedly connected to a housing of the speaker, respectively, and the vibration output end 113 of each drive unit 110 may be connected to the vibration transmission unit 150 by an elastic connection member 160. Further, the vibration transmission unit 150 may be connected to a vibration portion (e.g., a diaphragm assembly) of the speaker, thereby transmitting vibration to the vibration portion of the speaker.

In some embodiments, as shown in FIG. 6, the reinforcement layer 130, the substrate layer 140, and the piezoelectric layer 120 of the drive unit 110 may have equal lengths along the extension direction (i.e., XX' direction) of the beam-like structure (or the drive unit 110). In the extension direction of the drive unit 110, the reinforcement layer 130 may cooperate with the substrate layer 140 to jointly regulate the position of the neutral plane of the drive unit 110 and the stiffness of the drive unit 110. For example, the thickness of the reinforcement layer 130 and/or the substrate layer 140 may be increased such that a distance between the neutral plane of the drive unit 110 and the geometric center plane of the piezoelectric layer 120 is increased. As another example, the adjustment of the position of the neutral plane of the drive unit 110 and the adjustment of the stiffness of the drive unit 110 may be achieved by partially covering or fully covering the substrate layer 140 with the reinforcement layer 130, thereby adjusting the structural reliability of the drive unit 110.

In some embodiments, as shown in FIGS. 5 and 6, a line segment L1 is selected along the extension direction of the drive unit 110. In a width direction of the drive unit 110 (i.e., a direction perpendicular to both directions XX' and ZZ'), the drive unit 110 may be symmetrical along L1 (as shown in FIG. 5). A central point of a connection position of the drive unit 110 to the elastic connection member 160 is R0, a central point of a connection position of the drive unit 110 to the fixing component 170 is R1, and a direction from R0 to R1 is the extension direction of the beam-like structure of the drive unit 110. Strain values corresponding to the piezoelectric layer 120 at different positions on the line segment L1 may be used to characterize a strain change of the beam-like structure of the drive unit 110 at different positions along its extension direction.

As shown in FIG. 7, the horizontal coordinates in FIG. 7 indicate different positions on the line segment L1, and the vertical coordinates indicate a strain at the corresponding position on the piezoelectric layer 120, where the negative sign "−" of the value on the vertical axis represents a compressive strain. In the range of positions from R0 to R1, the piezoelectric layer 120 may be divided into four segments, which may be, in turn, an initial strain region R0-*a*, a small strain region a-b, a strain rapid increase region b-c, and a large strain region c-R1. As can be seen from FIG. 7, the strains generated by the piezoelectric layer 120 are different at different positions along the extension direction of the drive unit 110, i.e., they contribute different output displacement values to the drive unit 110. The strain in the initial strain region R0-*a* is the smallest; the strain in the small strain region a-b starts to increase, but the variation is small; the strain in the strain rapid increase region b-c continues to increase and the variation becomes large; the strain in the large strain region c-R1 is the largest and the variation is large. In the extension direction of the drive unit 110 (i.e., a direction of R0 pointing to R1), the closer the position to the fixed end 111 of the drive unit 110 (i.e., the closer to R1) is, the greater the strain of the piezoelectric layer 120 and the greater its strain contribution (i.e., the greater the contribution of this position to the bending deformation of the piezoelectric layer 120) is.

Thus, in some embodiments, according to the combination of the deformation amount contributed by the piezoelectric layer 120 at different positions along the extension direction of the drive unit 110 during actual operation with an average stress distribution of the piezoelectric layer 120 along the extension direction of the drive unit 110, the reinforcement layers 130 with different mass distributions (e.g., different reinforcement components) may be arranged at different positions in the extension direction of the beam-like structure, so as to adjust the load on the piezoelectric layer 120 and the overall stiffness of the drive unit 110 while effectively adjusting the position of the neutral plane of the drive unit 110, thereby causing the drive unit 110 outputs a larger displacement while enabling impedance matching or substantially matching between the drive unit 110 and its load (e.g., the vibration portion of the speaker), so that the displacement generated by the drive device 100 may be effectively transmitted. For example, the reinforcement layer 130 may not completely cover the piezoelectric layer 120, i.e., a length of the reinforcement layer 130 may be shorter than a length of the piezoelectric layer 120 (e.g., the dimension of the reinforcement layer 130 does not exceed one-half of the distance $l_d$ from the vibration output end 113 to the fixed end 111). For example, for an application scenario where the load of the drive device 100 is small, the reinforcement layer 130 may be arranged at a position near the vibration output end 113 of the drive unit 110 (e.g., the initial strain region R0-*a*) to reduce the constraint of the reinforcement layer 130 on the beam-like structure during bending and deformation, reduce the deformation resistance of the beam-like structure, and enhance the deformation capacity of the beam-like structure, thereby enhancing the output capability of the beam-like structure and improving the output performance of the drive unit 110. It should be noted that "near" or "close to" the vibration output end 113 (or the fixed end 111) in the present disclosure means that a shortest distance from the corresponding position to the vibration output end 113 (or the fixed end 111) is no more than 20% of the distance from the vibration output end 113 to the fixed end 111. Further, in the case of the same mass of the reinforcement layer, since the reinforcement layer 130 becomes shorter, which corresponds to a lighter load on the piezoelectric layer 120, at this time, the thickness of the reinforcement layer 130 may be further increased, thereby increasing the distance between the geometric center plane of the piezoelectric layer 120 and the neutral plane of the drive unit 110 (i.e., $h_3-h$ in equation (4)) and improving the output performance of the drive unit 110. As another example, for an application scenario where the load of the drive device 100 is large, the reinforcement layer 130 may include multiple reinforcement components. Dimensions of the multiple reinforcement components along the extension direction may be decreasing at first and then increasing. For more information about the reinforcement layers with different mass distributions, please refer to FIG. 8, FIG. 9, FIG. 12, and FIG. 13 and their related descriptions in the present disclosure.

Figure 8:
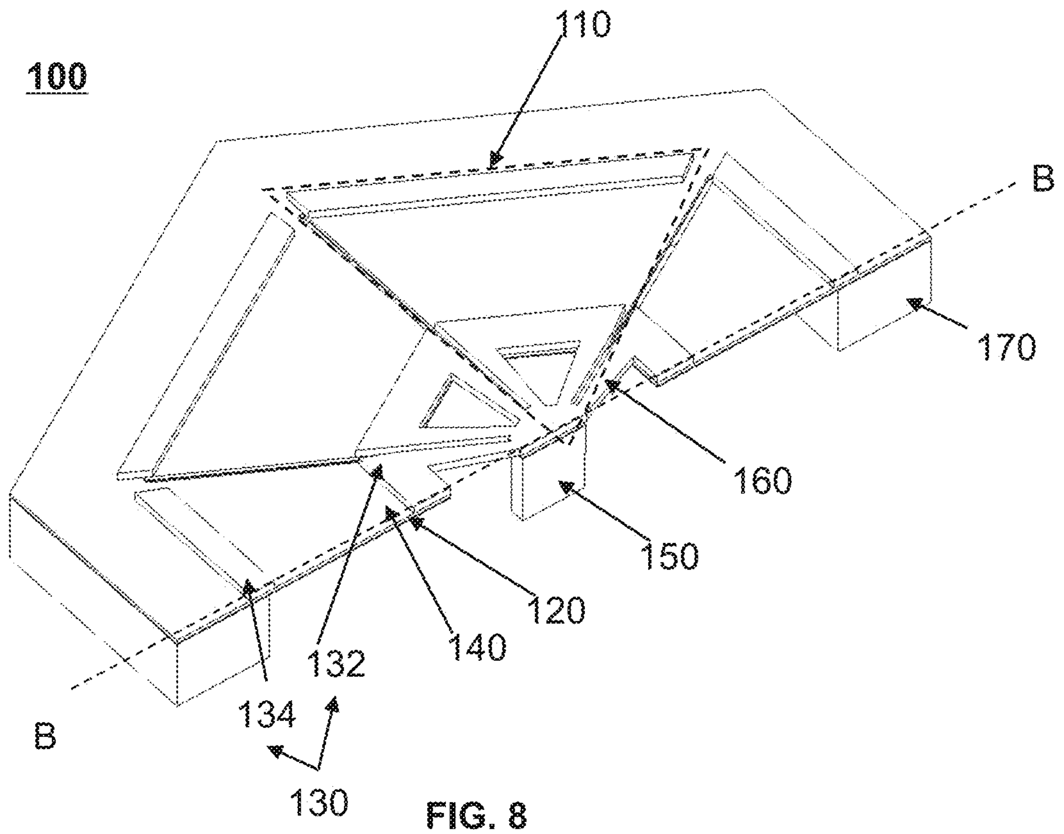
FIG. 8 is a schematic diagram illustrating a portion of a structure of an exemplary drive device according to some embodiments of the present disclosure.
Figure 9:
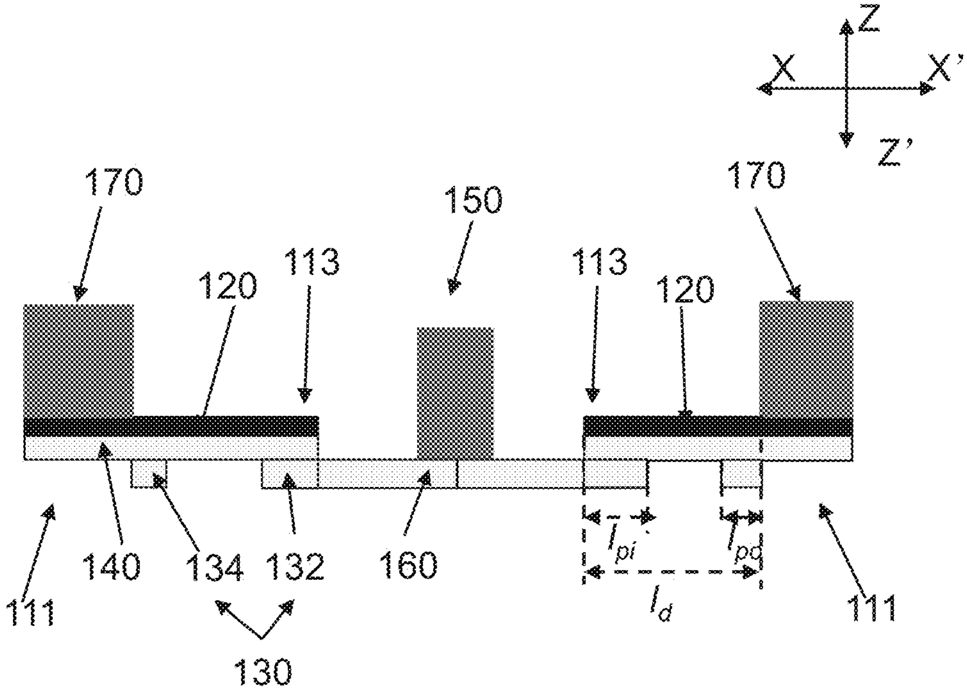
FIG. 9 is a schematic diagram illustrating a B-B cross-section of the drive device in FIG. 8.

FIG. 8 is a schematic diagram illustrating a portion of a structure of an exemplary drive device according to some embodiments of the present disclosure. FIG. 9 is a schematic diagram illustrating a B-B cross-section of the drive device in FIG. 8. In some embodiments, the drive device 100 as shown in FIG. 8 and FIG. 9 may be applied in application scenarios where its load is small. For an application scenario where the load of the drive device 100 is small (e.g., when the drive device 100 is applied in a speaker, the drive device 100 acts directly as an acoustic pressure drive portion to push the air load to generate acoustic pressure), the structure of the drive unit 110 may be designed such that the beam-like structure of the drive unit 110 itself (e.g., the reinforcement layer 130 and the substrate layer 140) generates a smaller load on the piezoelectric layer 120, so as to increase the output displacement of the drive device 100 while reducing the stiffness of the drive unit 110 (or the drive device 100) so that the impedance of the drive device 100 matches or substantially matches the impedance of its load to transfer the vibration displacement of the drive device 100 to its load in the most efficient manner.

Figure 13:
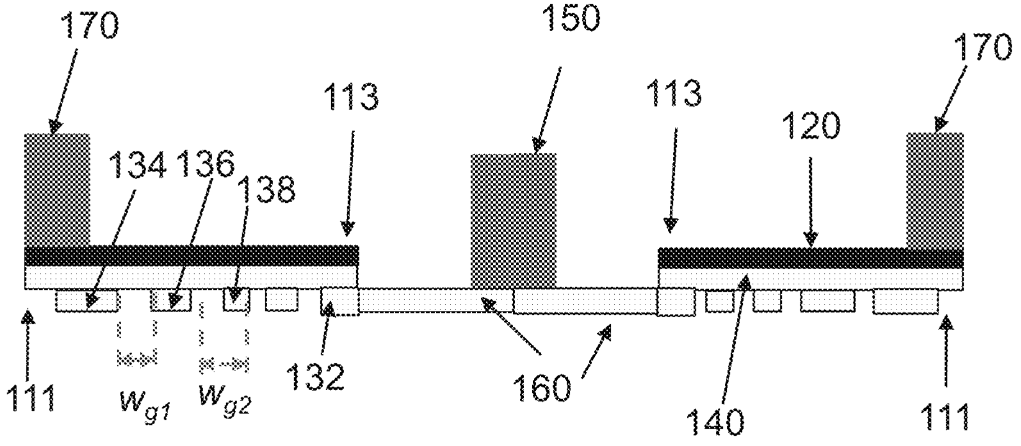
FIG. 13 is a schematic diagram illustrating a C-C cross-section of the drive device in FIG. 12.

In some embodiments, the reinforcement layer 130 may include a first reinforcement component (i.e., reinforcement component 132) and a second reinforcement component (i.e., reinforcement component 134). A sum of dimensions of the first reinforcement component 132 and the second reinforcement component 134 along the extension direction may be smaller than the dimension of the piezoelectric layer 120 along the extension direction. The first reinforcement component 132 may be provided at a position close to the vibration output end 113 and the second reinforcement component 134 may be provided at a position close to the fixed end 111. In this arrangement, through the first reinforcement component 132 and the second reinforcement component 134, a distance between the position of the neutral plane of the beam-like structure and the position of the geometric center plane of the piezoelectric layer 120 can be increased, so as to enhance the output displacement of the drive unit 110 and strengthen the output capability of the drive unit 110; through the second reinforcement component 134, the support to the area with larger strain on the drive unit 110 can be strengthened, the possibility of the drive unit 110 being damaged during operation can be reduced, and the reliability of the drive device 100 can be enhanced. In some embodiments, the reinforcement layer 130 may include only the first reinforcement component 132 arranged near the vibration output end 113 without the second reinforcement component 134. In some embodiments, the dimension of the first reinforcement component 132 in the extension direction of the drive unit 110 may not exceed one-half of the distance $l_d$ from the vibration output end 113 to the fixed end 111. In some embodiments, the dimension of the first reinforcement component 132 in the extension direction of the drive unit 110 may be adjusted according to the arrangement manner of the reinforcement components in the reinforcement layer 130. For example, when the reinforcement layer 130 includes only the first reinforcement component 132 arranged near the vibration output end 113, the dimension of the first reinforcement component 132 may be arranged slightly larger (e.g., more than one-half of the distance $l_d$ from the vibration output end 113 to the fixed end 111) to ensure that the distance between the position of the neutral plane of the beam-like structure and the position of the geometric center plane of the piezoelectric layer 120 meets the demand. As another example, when the reinforcement layer 130 includes both the first reinforcement component 132 and the second reinforcement component 134, the first reinforcement component 132 may be slightly smaller in dimension (e.g., between one-fifth and three-fifth of the distance $l_d$ from the vibration output end 113 to the fixed end 111) to adjust the distance between the position of the neutral plane of the beam-like structure and the position of the geometric center plane of the piezoelectric layer 120 in cooperation with the second reinforcement component 134. As another example, when the reinforcement layer 130 includes simultaneously multiple reinforcement components (as shown in FIG. 13), the first reinforcement component 132 may be somewhat smaller in dimension (e.g., between one-tenth and one-half of the distance $l_d$ from the vibration output end 113 to the fixed end 111) to adjust the distance between the position of the neutral plane of the beam-like structure and the position of the geometric center plane of the piezoelectric layer 120 and the stiffness of the beam-like structure, etc., in cooperation with the other reinforcement components.

In some embodiments, in order to better fix the drive unit 110, the fixed end 111 of the drive unit 110 may overlap with the fixing component 170 in the ZZ' direction, and a portion that overlaps with the fixing component 170 (i.e., the fixed end 111) may not participate in the vibration during the vibration of the drive unit 110. In the present disclosure, the dimension of the drive unit 110 in its extension direction refers to a dimension of the portion of the drive unit 110 that can vibrate freely (e.g., the portion that does not overlap with the fixing component 170), a value of which equals to the length of a centerline of the drive unit 110 along the extension direction. For example, the dimension of the drive unit 110 in its extension direction in the drive device 100 as shown in FIG. 5 is equal to the distance between R0 and R1. In some embodiments, the dimension of the drive unit 110 in its extension direction may also be referred to as the equivalent length of the drive unit 110.

As shown in FIG. 9, a ratio β of the dimension $l_{po}$ of the second reinforcement component 134 along the extension direction of the drive unit 110 to the dimension $l_d$ of the drive unit 110 along its extension direction meets:

$$\beta = \frac{l_{po}}{l_d}. \tag{7}$$

A ratio γ of the dimension $l_{pi}$ of the first reinforcement component 132 along the extension direction of the drive unit 110 to the dimension $l_d$ of the drive unit 110 along its extension direction meets:

$$\gamma = \frac{l_{pi}}{l_d}. \tag{8}$$

By setting different values of β and γ, it is possible to adjust the load of the reinforcement layer 130 on the piezoelectric layer 120 while also enabling the reinforcement layer 130 to adjust the position of the neutral plane of the drive unit 110 and the stiffness of the drive unit 110, so that the output displacement of the drive unit 110 meets different needs. In some embodiments, β may take a value in a range of 0.05-0.25. In some embodiments, γ may take a value in a range of 0.05-0.3.

In some embodiments, the thickness of the first reinforcement component 132 and the second reinforcement component 134 in the vibration direction of the vibration output end 113 (i.e., the direction ZZ') may be the same to facilitate the preparation of the reinforcement layer 130 (or the drive unit 110). Referring to FIG. 2, in some embodiments, a ratio δ of the thickness $t_1$ of each reinforcement component (or the reinforcement layer 130) to the thickness $t_2$ of the substrate layer 140 may meet:

$$\delta = \frac{t_1}{t_2}. \tag{9}$$

When the substrate layer 140 covers all of the piezoelectric layer 120, for the same total thickness, the ratio δ of the thickness $t_1$ of each reinforcement component (or the reinforcement layer 130) to the thickness $t_2$ of the substrate layer 140 may affect the stiffness of the drive unit 110 (or the drive device 100), thereby affecting the output performance (e.g., transfer performance) of the drive unit 110. In some embodiments, in order to ensure that a strong reliability of the drive unit 110 is achieved while the load on the piezoelectric layer 120 is relatively small, the ratio δ of the thickness $t_1$ of the reinforcement layer 130 to the thickness $t_2$ of the substrate layer 140 may take a value in a range of 0.5 to 2.5. In some embodiments, the ratio δ of the thickness $t_1$ of the reinforcement layer 130 to the thickness $t_2$ of the substrate layer 140 may take a value in a range of 0.8 to 2. In some embodiments, the ratio δ of the thickness $t_1$ of the reinforcement layer 130 to the thickness $t_2$ of the substrate layer 140 may take a value in a range of 1-1.5.

In some embodiments, in order to further reduce the load on the piezoelectric layer 120 under conditions that cause the smallest possible impact on the neutral plane position of the drive unit 110, thereby further enhancing the output performance of the drive unit 110, at least one reinforcement component (e.g., the first reinforcement component 132 or the second reinforcement component 134) may include multiple corresponding sub-reinforcement components. The multiple sub-reinforcement components corresponding to each reinforcement component may be arranged at intervals in a direction perpendicular to the extension direction of the drive unit 110, i.e., the multiple sub-reinforcement components corresponding to each reinforcement component may be arranged at intervals along the width direction of the drive unit 110.

Figure 10:
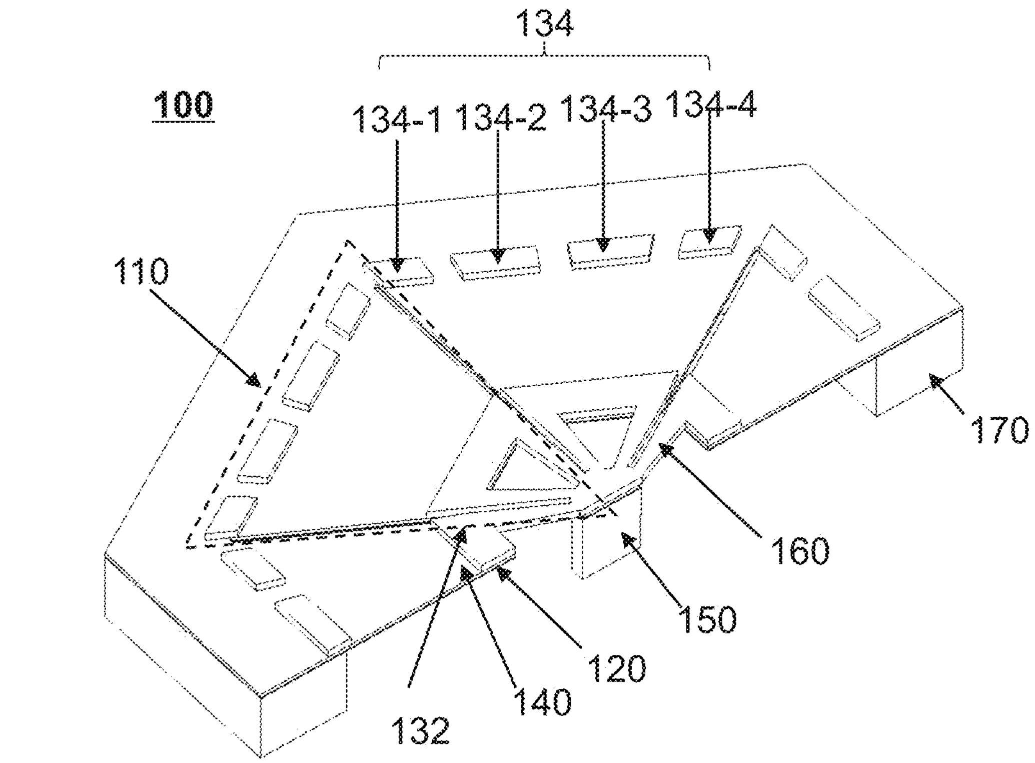
FIG. 10 is a schematic diagram illustrating a portion of a structure of an exemplary drive device according to some embodiments of the present disclosure.
Figure 11:
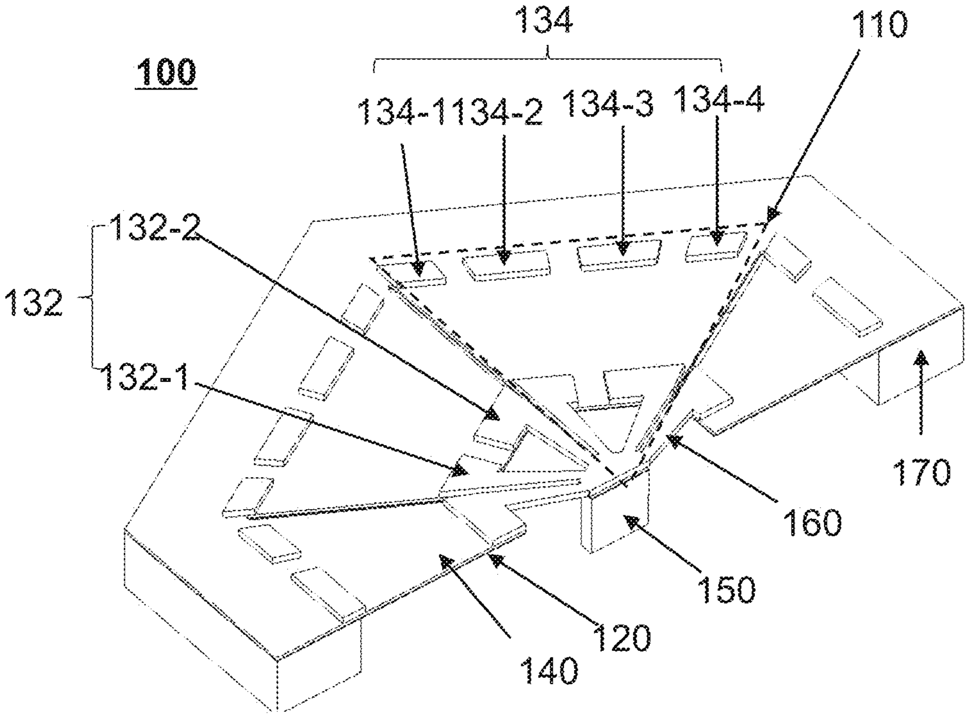
FIG. 11 is a schematic diagram illustrating a portion of a structure of an exemplary drive device according to some embodiments of the present disclosure.

FIG. 10 is a schematic diagram illustrating a portion of a structure of an exemplary drive device according to some embodiments of the present disclosure. FIG. 11 is a schematic diagram illustrating a portion of a structure of an exemplary drive device according to some embodiments of the present disclosure. As shown in FIG. 10, in some embodiments, the second reinforcement component 134 may include multiple corresponding sub-reinforcement components (e.g., sub-reinforcement components 134-1, 134-2, 134-3, 134-4, etc.) arranged at intervals along the width direction of the drive unit 110. As shown in FIG. 11, the first reinforcement component 132 may include multiple sub-reinforcement components (e.g., sub-reinforcement component 132-1, 132-2, etc.) correspondingly arranged at intervals along the width direction of the drive unit 110, and the second reinforcement component (reinforcement component 134) also includes multiple sub-reinforcement components (e.g., sub-reinforcement components 134-1, 134-2, 134-3, 134-4, etc.) correspondingly arranged at intervals along the width direction of the drive unit 110.

Figure 12:
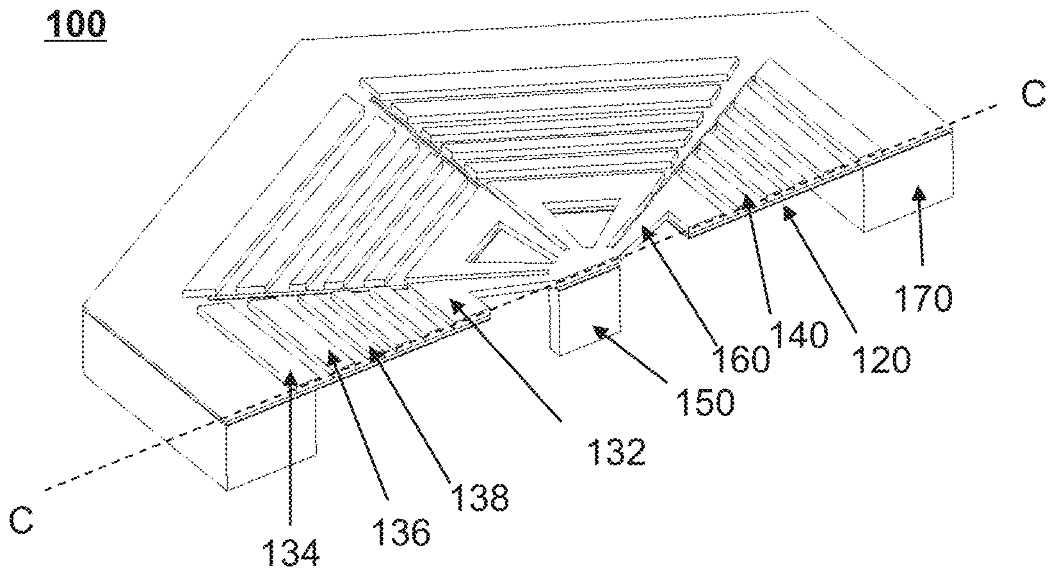
FIG. 12 is a schematic diagram illustrating a portion of a structure of an exemplary drive device according to some embodiments of the present disclosure.

FIG. 12 is a schematic diagram illustrating a portion of a structure of an exemplary drive device according to some embodiments of the present disclosure. FIG. 13 is a schematic diagram illustrating a C-C cross-section of the drive device in FIG. 12. In some embodiments, the drive device 100 as shown in FIG. 12 and FIG. 13 may be applied in an application scenario where its load is large. For the application scenario where the load of the drive device 100 is large (e.g., when the drive device 100 is used in a speaker where the mass and spring stiffness in the mass-spring-damping system formed by the vibration portion of the speaker are both large), the structure of the drive unit 110 may be designed so that the drive unit 110 has a large stiffness such that the impedance of the drive device 100 matches or substantially matches the impedance of its load to transfer the vibration displacement of the drive device 100 to its load in the most efficient manner.

In some embodiments, the stiffness of the drive unit 110 may be adjusted by directly increasing the thickness of the substrate layer 140 and the thickness of the reinforcement layer 130. However, increasing the thickness of the substrate layer 140 and the thickness of the reinforcement layer 130 may also increase the load on the piezoelectric layer 120, resulting in a decrease in the output of the drive unit 110. To solve the above problems, in some embodiments, as shown in FIG. 12 and FIG. 13, the reinforcement layer 130 may include multiple reinforcement components (e.g., reinforcement components 132, 134, 136, 138, etc.) arranged at intervals along the extension direction of the drive unit 110. By arranging the multiple reinforcement components at intervals along the extension direction of the drive unit 110, on the one hand, it is possible to keep the load (i.e., the total mass of the substrate layer 140 and the reinforcement layer 130) constant or reduced while continuing to increase the thickness of the reinforcement layer 130 (e.g., the thickness of the individual reinforcement components), thereby increasing the distance between the neutral plane of the drive unit 110 and the geometric center plane of the piezoelectric layer 120; On the other hand, by arranging the reinforcement components at intervals, the stiffness of the drive unit 110 may also be adjusted to achieve impedance matching between the drive unit 110 and its load, thus comprehensively improving the output performance of the drive unit 110.

In some embodiments, the reinforcement component 132 may be arranged as a first reinforcement component at a position of the drive unit 110 near the vibration output end 113, and the reinforcement component 134 may be arranged as a second reinforcement component at a position of the drive unit 110 near the fixed end 111. Other reinforcement components (e.g., reinforcement components 136, 138, etc.) may be arranged at intervals between the first reinforcement component and the second reinforcement component along the extension direction of the beam-like structure of the drive unit 110. In some embodiments, the thicknesses of the multiple reinforcement components in the vibration direction of the vibration output end 113 may be the same or different. For example, the thicknesses of the multiple reinforcement components in the vibration direction of the vibration output end 113 may be the same to facilitate preparation of the reinforcement layer 130 (or the drive unit 110). As another example, the thicknesses of the multiple reinforcement components in the vibration direction of the vibration output end 113 may be different. Specifically, the thickness of a reinforcement component near the vibration output end 113 may be greater than the thickness of a reinforcement component located in a middle region of the beam-like structure due to the fact that the reinforcement component near the vibration output end 113 is less constrained when the beam-like structure is bent and deformed while the reinforcement component located in the middle region of the beam-like structure is more constrained when the beam-like structure is bent and deformed. In some embodiments, the stiffness of the drive unit 110 may be adjusted by adjusting a magnitude of a distance between each two adjacent reinforcement components in the extension direction of the beam-like structure. In some embodiments, the magnitude of the distance between each two adjacent reinforcement components in the extension direction of the beam-like structure may be the same or different. For example, the magnitude $w_{g1}$ of the distance between the reinforcement component 134 and the reinforcement component 136 may be different from the magnitude $w_{g2}$ of the distance between the reinforcement component 136 and the reinforcement component 138. In some embodiments, the distance between any two adjacent reinforcement components in the extension direction of the beam-like structure may take a value in a range of 20-200 μm.

In some embodiments, the dimensions of the multiple reinforcement components along the extension direction may be the same or different. For example, the dimensions of the multiple reinforcement components along the extension direction may be the same. As another example, the dimensions of the multiple reinforcement components along the extension direction of the beam-like structure (e.g., a direction from the vibration output end 113 to the fixed end 111) may gradually decrease or gradually increase. As another example, the dimensions of the multiple reinforcement components along the extension direction of the beam-like structure may be randomly and arbitrarily arranged.

In some embodiments, for an application scenario where the load on the drive device 100 is large, in order to reduce the load on the piezoelectric layer 120 and reduce the deformation constraint on an area with larger strain of the beam-like structure (e.g., the large strain region c-R1, etc.) while enhancing the reliability of the drive unit 110, thereby reducing the deformation resistance of the beam-like structure and enhancing the deformation capability of the drive unit 110, and thus enhance the output capability of the drive unit 110, dimensions of the multiple reinforcement components along the extension direction may be decreasing at first and then increasing. In other words, larger sized reinforcement components may be arranged close to the vibration output end 113 and/or fixed end 111 and smaller sized reinforcement components can be arranged at the middle portion of the beam-like structure. Specifically, by arranging one or more reinforcement components of a larger size at a position near the vibration output end 113, the thickness of the reinforcement component(s) may be adjusted by the reinforcement component of the larger size in a region with small strain (e.g., the small strain region a-b) while reducing the constraint on the beam-like structure during deformation; by arranging one or more reinforcement components of the larger size near the fixed end 111, the stiffness of the beam-like structure may be enhanced by the reinforcement component(s) of the larger size in a region with larger strain (e.g., the large strain region c-R1), thereby making the beam-like structure less likely to break during bending vibration and enhancing the reliability of the beam-like structure; by arranging one or more reinforcement components of a smaller size in the middle region of the beam-like structure, the deformation constraint of the reinforcement component(s) on the beam-like structure may be minimized while increasing the stiffness of the beam-like structure, thus reducing the deformation resistance of the beam-like structure and making the deformation capability of the beam-like structure stronger. In some embodiments, the dimensions of the reinforcement components arranged within a first distance from the vibration output end 113 along the extension direction may be in a range of 50-400 μm, and the dimensions of the reinforcement components arranged within a range of the first distance to a second distance from the vibration output end 113 along the extension direction may be in a range of 20-200 μm. Further, the dimensions of the reinforcement components arranged within a range from the second distance to a third distance from the vibration output end 113 along the extension direction may be in a range of 20-100 μm, and the dimensions of the reinforcement components arranged at a distance above the third distance from the vibration output end 113 along the extension direction may be in a range of 50-400 μm. In some embodiments, the first distance may be less than or equal to $\frac{1}{5}$ of the distance $l_d$ from the vibration output end 113 to the fixed end 111 (i.e., $l_d/5$). The second distance may be less than or equal to $\frac{2}{5}$ of the distance $l_d$ from the vibration output end 113 to the fixed end 111 (i.e., $2l_d/5$), and the second distance is greater than the first distance. The third distance may be less than or equal to $\frac{14}{15}$ of the distance $l_d$ from the vibration output end 113 to the fixed end 111 (i.e., $14l_d/15$), and the third distance is greater than the second distance.

In some embodiments, in order to further reduce the load on the piezoelectric layer 120 under the condition that the position of the neutral plane of the drive unit 110 is affected as little as possible to further enhance the output performance of the drive unit 110, at least one reinforcement component may include multiple corresponding sub-reinforcement components. The multiple sub-reinforcement components corresponding to each reinforcement component may be arranged at intervals in a direction perpendicular to the extension direction of the drive unit 110, i.e., the multiple sub-reinforcement components corresponding to each reinforcement component may be arranged at intervals along the width direction of the drive unit 110.

Figure 14:
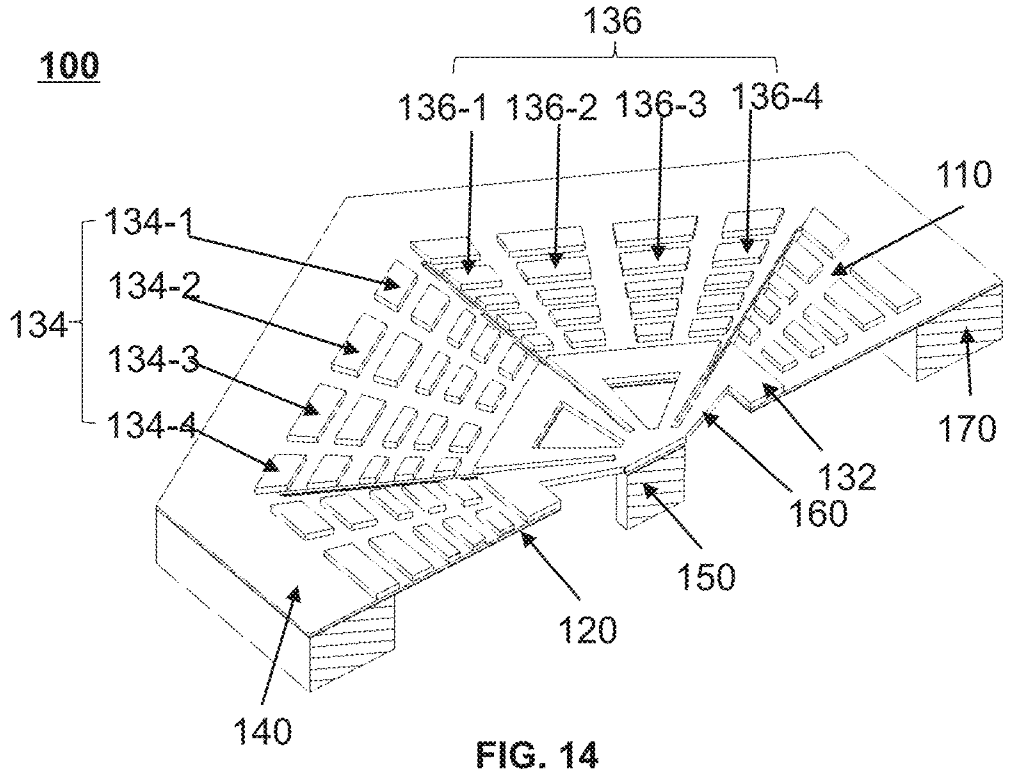
FIG. 14 is a schematic diagram illustrating a portion of a structure of an exemplary drive device according to some embodiments of the present disclosure.

FIG. 14 is a schematic diagram illustrating a portion of a structure of an exemplary drive device according to some embodiments of the present disclosure. As shown in FIG. 14, in some embodiments, among the multiple reinforcement components arranged at intervals along the extension direction of the beam-like structure, some of the reinforcement components may include corresponding multiple sub-reinforcement components, and the remaining portions of the reinforcement components may not include sub-reinforcement components. For example, the reinforcement component 132 may not include a sub-reinforcement component, the reinforcement component 134 may include corresponding multiple sub-reinforcement components 134-1, 134-2, 134-3, 134-4, etc., and the reinforcement component 136 may include corresponding multiple sub-reinforcement components 136-1, 136-2, 136-3, 136-4, etc.

It should be known that when the drive unit 110 with a beam-like structure produces bending deformation during operation, it can be approximated as a form of bending deformation of a cantilever beam-like structure under a uniform load, and for this type of deformation, the vibration output end 113 of the beam-like structure may output a displacement y in its thickness direction (e.g., in the ZZ' direction in FIG. 2 and FIG. 3) that meets:

$$y = \frac{ql_d^4}{8EI}, \tag{10}$$

where q denotes the uniform load, $l_d$ denotes the dimension of the beam-like structure along its extension direction (or the equivalent length of the beam-like structure), E denotes the Young's modulus of the beam-like structure, and I denotes the rotational inertia of the beam-like structure.

According to equation (10), by increasing the equivalent length $l_d$ of the beam-like structure, the output displacement y of the beam-like structure can be increased, thus improving the output performance of the drive unit 110 (or the drive device 100). In some embodiments, under the same dimensions of the drive device 100, the equivalent length $l_d$ of the beam-like structure of the drive unit 110 can be increased to make the output displacement y of the beam-like structure increase.

Figure 15:
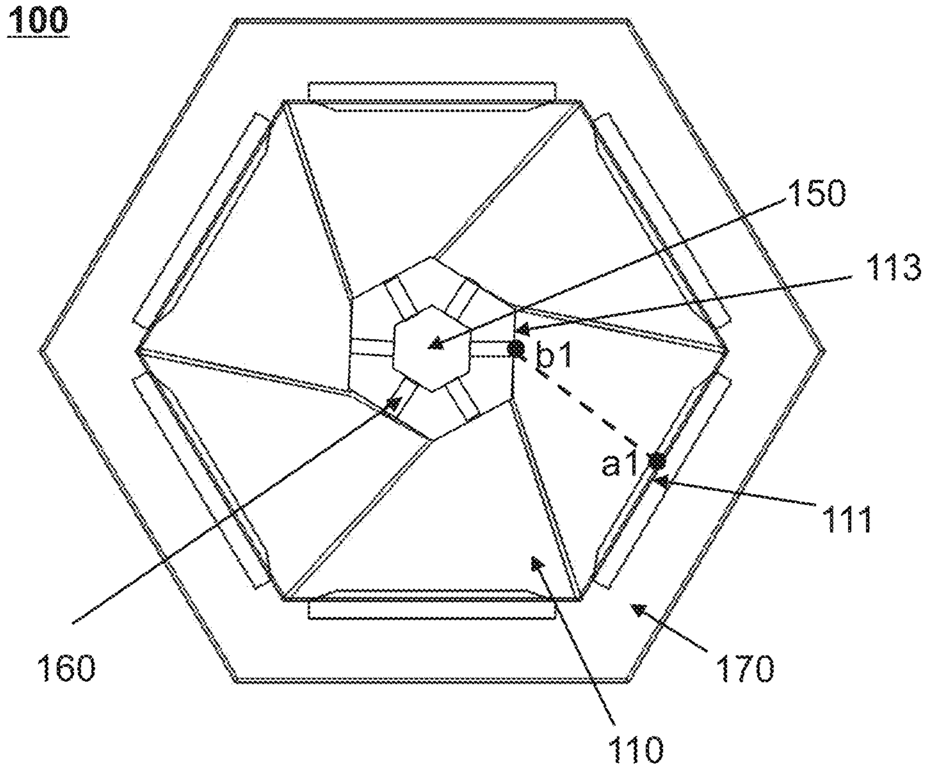
FIG. 15 is another schematic diagram illustrating some structures of exemplary drive devices according to some embodiments of the present disclosure.
Figure 16:
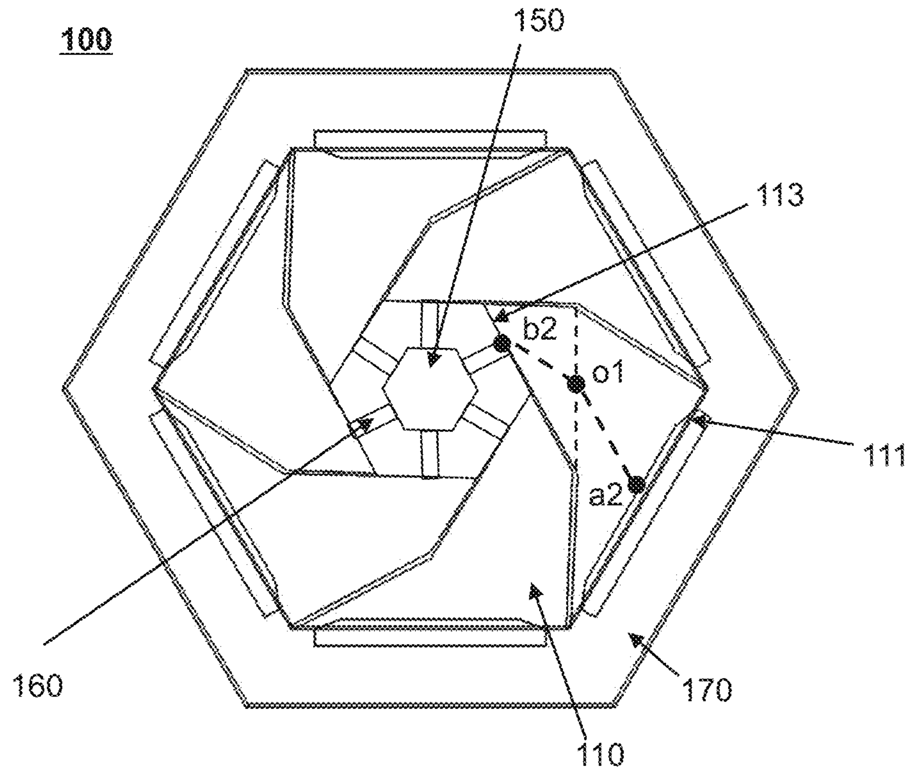
FIG. 16 is another schematic diagram illustrating some structures of exemplary drive devices according to some embodiments of the present disclosure.
Figure 18:
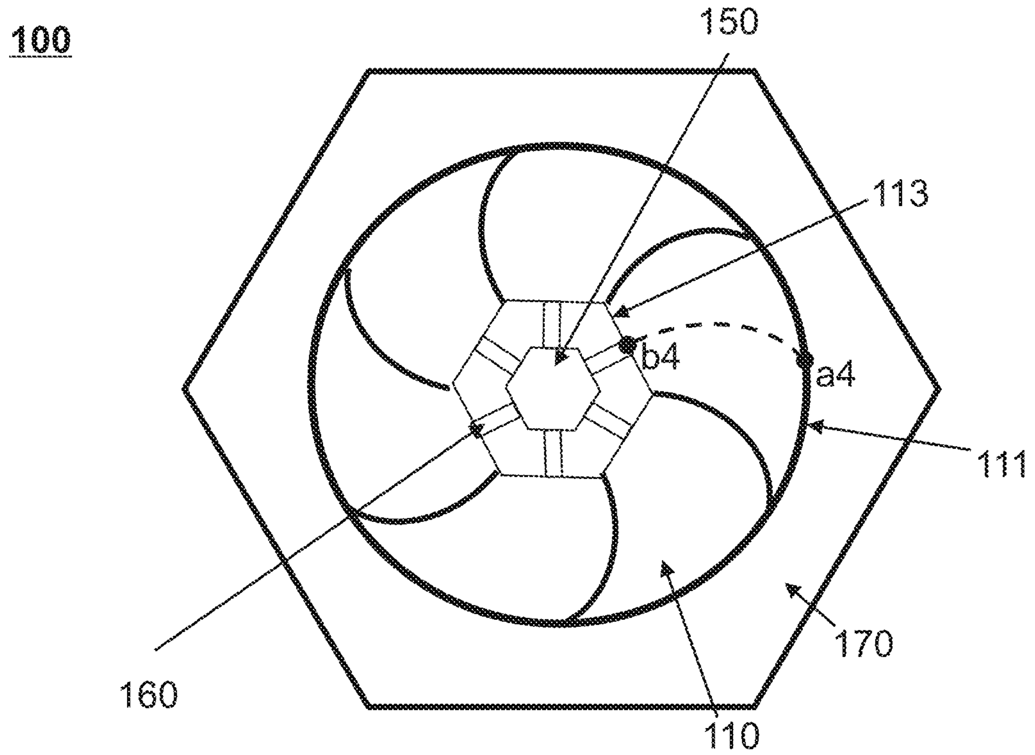
FIG. 18 is another schematic diagram illustrating some structures of exemplary drive devices according to some embodiments of the present disclosure.
Figure 20:
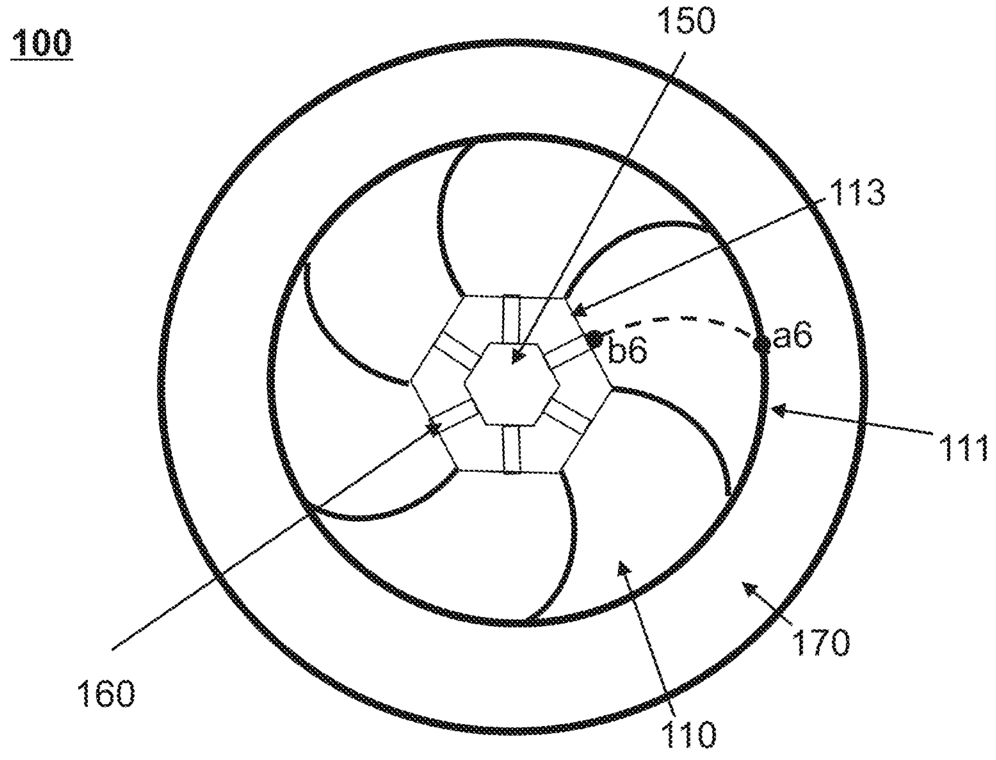
FIG. 20 is another schematic diagram illustrating some structures of exemplary drive devices according to some embodiments of the present disclosure.

FIG. 15 to FIG. 21 are schematic diagrams illustrating some other structures of exemplary drive devices according to some embodiments of the present disclosure. In some embodiments, as shown in FIGS. 15 to 21, the drive device 100 may include one or more drive units 110. The beam-like structure of the one or more drive units 110 may be desired with a rotary bending design to increase the equivalent length $l_d$ of the drive unit 110. Exemplarily, as shown in FIGS. 15 to 21, the beam-like structure of the drive unit 110 may have a helical structure bent in a clockwise or counterclockwise direction. As shown in FIG. 15, the drive unit 110 has straight edges on both sides from the fixed end 111 to the vibration output end 113. While keeping the dimensions of the drive device 100 unchanged, by simultaneously tilting both side edges in the same direction, the vibration output end 113 can be set further away from the fixed end 111, thereby increasing the equivalent length $l_d$ of the drive unit 110. The equivalent length $l_d$ of the drive unit 110 may be equal to a distance between the geometric center point a1 of its fixed end 111 to the geometric center point b1 of the vibration output end 113. As shown in FIG. 16, both side edges of the drive unit 110 from the fixed end 111 to the vibration output end 113 are bending lines. While keeping the dimensions of the drive device 100 unchanged, by simultaneously bending both side edges in the same direction, the vibration output end 113 can be set further away from the fixed end 111, thereby increasing the equivalent length $l_d$ of the drive unit 110. The equivalent length $l_d$ of this drive unit 110 may be equal to a sum of a distance between the geometric center point a2 of its fixed end 111 to the geometric center point o1 of a line connecting bending points and a distance between the point a1 to the geometric center point b2 of the vibration output end 113. Similarly, as shown in FIG. 17, both side edges of the drive unit 110 from the fixed end 111 to the vibration output end 113 are bending lines. The equivalent length $l_d$ of this drive unit 110 may be equal to a sum of a distance between the geometric center point a3 of its fixed end 111 to the geometric center point c1 of a first line connecting bending points, a distance between the point c1 to the geometric center point c2 of a second line connecting bending points, a distance between the point c2 to the geometric center point c3 of a third line connecting bending points, and a distance between the point c3 to the geometric center point b3 of the vibration output end 113. As shown in FIG. 18, the edge of the fixed end 111 of the drive unit 110 is an arc, and the edge of the vibration output end 113 is a straight line. Both side edges of the drive unit 110 pointing from the fixed end 111 to the vibration output end 113 are arcs. While keeping the dimensions of the drive device 100 unchanged, by simultaneously bending both side edges in the same direction, the vibration output end 113 can be set further away from the fixed end 111, thereby increasing the equivalent length $l_d$ of the drive unit 110. The equivalent length $l_d$ of this drive unit 110 may be equal to a length of a centerline (also called a mid-arc) between the geometric center point a4 of its fixed end 111 to the geometric center point b4 of the vibration output end 113. Similarly, as shown in FIG. 19, both edges of the fixed end 111 and the vibration output end 113 of the drive unit 110 are arcs. Both side edges of the drive unit 110 pointing from the fixed end 111 to the vibration output end 113 are also arcs. The equivalent length $l_d$ of this drive unit 110 may be equal to a length of a centerline (also referred to as a mid-arc) between the geometric center point a5 of its fixed end 111 to the geometric center point b5 of its vibration output end 113. The shape of the drive unit as shown in FIG. 20 is the same as that of the drive unit shown in FIG. 18, with the difference that the drive device 100 shown in FIG. 20 is circular, while the drive device 100 shown in FIG. 18 is a regular hexagon. The equivalent length $l_d$ of this drive unit 110 may be equal to a length of a centerline between the geometric center point a6 of its fixed end 111 to the geometric center point b6 of the vibration output end 113. The shape of the drive unit as shown in FIG. 21 is the same as that of the drive unit shown in FIG. 19, with the difference that the drive device 100 shown in FIG. 21 is circular, while the drive device 100 shown in FIG. 19 is a regular hexagon. The equivalent length $l_d$ of this drive unit 110 may be equal to a length of a centerline between the geometric center point a7 of its fixed end 111 to the geometric center point b7 of the vibration output end 113. It should be noted that other structures of the drive device 100 shown in FIGS. 15 to 17 (e.g., a thickness ratio of the reinforcement layer 130 to the substrate layer 140, the structure of the reinforcement layer 130, etc.) can be referred to elsewhere in the present disclosure (e.g., FIGS. 2 to 14 and their related descriptions) and are not repeated herein.

The basic concepts have been described above, apparently, in detail, as will be described above, and does not constitute limitations of the disclosure. Although there is no clear explanation here, those skilled in the art may make various modifications, improvements, and modifications of the present disclosure. This type of modification, improvement, and corrections are recommended in the present disclosure, so the modification, improvement, and the amendment remain in the spirit and scope of the exemplary embodiment of the present disclosure.

At the same time, the present disclosure uses specific words to describe the embodiments of the present disclosure. As "one embodiment," "an embodiment," and/or "some embodiments" means a certain feature, structure, or characteristic of at least one embodiment of the present disclosure. Therefore, it is emphasized and should be appreciated that two or more references to "an embodiment," or "one embodiment," or "an alternative embodiment" in various parts of the present disclosure are not necessarily all referring to the same embodiment. Further, certain features, structures, or features of one or more embodiments of the present disclosure may be combined.

Further, it can be understood by those skilled in the art that aspects of the present disclosure can be illustrated and described by a number of patentable categories or situations, including any new and useful combination of processes, machines, products, or substances, or any new and useful improvements to them. Accordingly, aspects of the present disclosure may be performed entirely by hardware, may be performed entirely by software (including firmware, resident software, microcode, etc.), or may be performed by a combination of hardware and software. Each of the above hardware or software may be referred to as a "data block," "module," "engine," "unit," "component," or "system." In addition, aspects of the present disclosure may be represented as a computer product located in one or more computer-readable media, which includes computer-readable program code.

The computer storage medium may contain a propagated data signal with a computer program encoded within it, for example on a baseband or as part of a carrier wave. The propagation signal may have a variety of manifestations, including an electromagnetic form, an optical form, or the like, or a suitable combination. The computer storage medium may be any computer-readable medium other than a computer-readable storage medium that may be connected to an instruction execution system, device, or apparatus to enable communication, propagation, or transmission of a program for use. The program code located on the computer storage medium may be transmitted via any suitable medium, including a radio, a cable, a fiber optic cable, an RF, or similar medium, or any combination of the foregoing.

Moreover, unless the claims are clearly stated, the sequence of the present disclosure, the use of the digital letters, or the use of other names is not configured to define the order of the present disclosure processes and methods. Although some examples of the disclosure currently considered useful in the present disclosure are discussed in the above disclosure, it should be understood that the details will only be described, and the appended claims are not limited to the disclosure embodiments. The requirements are designed to cover all modifications and equivalents combined with the substance and range of the present disclosure. For example, although the implementation of various components described above may be embodied in a hardware device, it may also be implemented as a software only scheme, e.g., an installation on an existing server or mobile device.

Similarly, it should be noted that in order to simplify the expression disclosed in the present disclosure and help the understanding of one or more embodiments, in the previous description of the embodiments of the present disclosure, a variety of features are sometimes combined into one embodiment, drawings or description thereof. However, this disclosure method does not mean that the characteristics required by the object of the present disclosure are more than the characteristics mentioned in the claims. Rather, claimed subject matter may lie in less than all features of a single foregoing disclosed embodiment.

In some embodiments, numbers expressing quantities of ingredients, properties, and so forth, configured to describe and claim certain embodiments of the application are to be understood as being modified in some instances by the term "about," "approximate," or "substantially." Unless otherwise stated, "approximately," "approximately" or "substantially" indicates that the number is allowed to vary by ±20%. Accordingly, in some embodiments, the numerical parameters used in the specification and claims are approximate values, and the approximate values may be changed according to characteristics required by individual embodiments. In some embodiments, the numerical parameters should be construed in light of the number of reported significant digits and by applying ordinary rounding techniques. Although the numerical domains and parameters used in the present disclosure are configured to confirm its range breadth, in the specific embodiment, the settings of such values are as accurately as possible within the feasible range.

For each patent, patent application, patent application publication and other materials referenced by the present disclosure, such as articles, books, instructions, publications, documentation, etc., hereby incorporated herein by reference. Except for the application history documents that are inconsistent with or conflict with the contents of the present disclosure, and the documents that limit the widest range of claims in the present disclosure (currently or later attached to the present disclosure). It should be noted that if a description, definition, and/or terms in the subsequent material of the present disclosure are inconsistent or conflicted with the content described in the present disclosure, the use of description, definition, and/or terms in this manual shall prevail.

Finally, it should be understood that the embodiments described herein are only configured to illustrate the principles of the embodiments of the present disclosure. Other deformations may also belong to the scope of the present disclosure. Thus, as an example, not limited, the alternative configuration of the present disclosure embodiment may be consistent with the teachings of the present disclosure. Accordingly, the embodiments of the present disclosure are not limited to the embodiments of the present disclosure clearly described and described.

What is claimed is:

1. A drive device comprising one or more drive units, each drive unit having a beam-like structure, the beam-like structure including a vibration output end and a fixed end and extending from the fixed end toward the vibration output end, each drive unit including:

- a piezoelectric layer configured to cause the drive unit to output a vibration from the vibration output end in response to an electrical signal; and
- a reinforcement layer, wherein the reinforcement layer includes one or more reinforcement components arranged along an extension direction of the beam-like structure, at least one reinforcement component of the one or more reinforcement components being arranged close to the vibration output end and having a dimension not exceeding one-half of a distance from the vibration output end to the fixed end along the extension direction.

2. The drive device of claim 1, wherein the one or more reinforcement components include a first reinforcement component and a second reinforcement component, the first reinforcement component being arranged close to the vibration output end and the second reinforcement component being arranged close to the fixed end.

3. The drive device of claim 2, wherein a ratio of a dimension of the first reinforcement component along the extension direction to the distance from the vibration output end to the fixed end is in a range of 0.05-0.3, or a ratio of a dimension of the second reinforcement component along the extension direction to the distance from the vibration output end to the fixed end is in a range of 0.05-0.25.

4. The drive device of claim 1, wherein the one or more reinforcement components include multiple reinforcement components arranged at intervals along the extension direction, and a distance between two adjacent reinforcement components in the extension direction is within a range of 20-200 μm.

5. The drive device of claim 4, wherein dimensions of the multiple reinforcement components along the extension direction are decreasing at first and then increasing.

6. The drive device of claim 5, wherein

- reinforcement components arranged within a first distance from the vibration output end along the extension direction have dimensions in a range of 50-400 μm; and
- reinforcement components arranged within a range of the first distance to a second distance from the vibration output end along the extension direction have dimensions in a range of 20-200 μm.

7. The drive device of claim 6, wherein the first distance is equal to ⅕ of the distance from the vibration output end to the fixed end, and the second distance is equal to ⅖ of the distance from the vibration output end to the fixed end.

8. The drive device of claim 6, wherein

- reinforcement components arranged in a range of the second distance to a third distance from the vibration output end along the extension direction have dimensions in a range of 20-100 μm; and
- reinforcement components arranged at a distance above the third distance from the vibration output end along the extension direction have dimensions in a range of 50-400 μm.

9. The drive device of claim 8, wherein the third distance is equal to $^{14}/_{15}$ of the distance from the vibration output end to the fixed end.

10. The drive device of claim 1, wherein at least one reinforcement component of the one or more reinforcement components includes multiple sub-reinforcement components arranged at intervals along a direction perpendicular to the extension direction.

11. The drive device of claim 1, wherein each drive unit further includes:

- a substrate layer, the substrate layer being disposed between the piezoelectric layer and the reinforcement layer.

12. The driver device of claim 11, wherein a ratio of a total thickness of the reinforcement layer and the substrate layer to a thickness of the piezoelectric layer is in a range of 3 to 20.

13. The drive device of claim 12, wherein a ratio of a thickness of the reinforcement layer to a thickness of the substrate layer is in a range of 0.5 to 2.5.

14. The drive device of claim 12, wherein the substrate layer covers a gap between the one or more drive units.

15. The drive device of claim 1, wherein a gap width between two adjacent drive units in the one or more drive units is less than 25 μm.

16. The drive device of claim 1, wherein the beam-like structure of the one or more drive units has a spiral structure bent in a clockwise or counterclockwise direction.

17. The drive device of claim 1, further including:

a vibration transmission unit, the vibration output end of each of the one or more drive units being connected to the vibration transmission unit such that the vibration of the drive device is output from the vibration transmission unit.

18. The drive device of claim 17, wherein the vibration transmission unit is connected to each drive unit by an elastic connection member.

19. An acoustic output device, the acoustic output device comprising one or more drive units, each drive unit having a beam-like structure, the beam-like structure including a vibration output end and a fixed end and extending from the fixed end toward the vibration output end, each drive unit including:

a piezoelectric layer configured to cause the drive unit to output a vibration from the vibration output end in response to an electrical signal; and a reinforcement layer, wherein the reinforcement layer includes one or more reinforcement components arranged along an extension direction of the beam-like structure, at least one reinforcement component of the one or more reinforcement components being arranged close to the vibration output end and having a dimension not exceeding one-half of a distance from the vibration output end to the fixed end along the extension direction.

20. The acoustic output device of claim 19, wherein the one or more reinforcement components include a first reinforcement component and a second reinforcement component, the first reinforcement component being arranged close to the vibration output end and the second reinforcement component being arranged close to the fixed end.

* * * * *